(12) United States Patent
Han

(10) Patent No.: US 11,957,040 B2
(45) Date of Patent: Apr. 9, 2024

(54) DISPLAY PANEL AND CURVED DISPLAY DEVICE

(71) Applicant: BOE Technology Group Co., Ltd., Beijing (CN)

(72) Inventor: Long Han, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 451 days.

(21) Appl. No.: 17/420,115

(22) PCT Filed: Dec. 29, 2020

(86) PCT No.: PCT/CN2020/140795
§ 371 (c)(1),
(2) Date: Jun. 30, 2021

(87) PCT Pub. No.: WO2021/179753
PCT Pub. Date: Sep. 16, 2021

(65) Prior Publication Data
US 2023/0157146 A1    May 18, 2023

(30) Foreign Application Priority Data

Mar. 13, 2020  (CN) .......................... 202010176869.7

(51) Int. Cl.
*H10K 77/10* (2023.01)
*H10K 59/131* (2023.01)
(Continued)

(52) U.S. Cl.
CPC ......... *H10K 77/111* (2023.02); *H10K 59/131* (2023.02); *H10K 59/353* (2023.02); *H10K 2102/311* (2023.02)

(58) Field of Classification Search
CPC .. H10K 77/111; H10K 59/131; H10K 59/353; H10K 2102/311; G09F 9/301
See application file for complete search history.

(56) References Cited

U.S. PATENT DOCUMENTS

2015/0115253 A1\* 4/2015 Ha ...................... H10K 59/123
438/23
2015/0263256 A1  9/2015 Hsieh et al.
(Continued)

FOREIGN PATENT DOCUMENTS

CN    108400240 A    8/2018
CN    109923676 A    6/2019
(Continued)

OTHER PUBLICATIONS

CN202010176869.7 first office action.
CN202010176869.7 second office action.

*Primary Examiner* — Elias Ullah
(74) *Attorney, Agent, or Firm* — IPro, PLLC

(57) ABSTRACT

The present disclosure relates to a display panel and a curved display device. The display panel includes a flexible substrate (100), including a first region (BB) and a second region (AA). The first region (BB) includes: a plurality of light emitting structures (110) with a first opening gap (200) formed between two adjacent light omitting structures (110); and a plurality of flexible bridging parts (120), with at least one flexible bridging part (120) connecting two adjacent light emitting structures (110).

19 Claims, 12 Drawing Sheets

(51) Int. Cl.
   *H10K 59/35* (2023.01)
   *H10K 102/00* (2023.01)

(56) References Cited

U.S. PATENT DOCUMENTS

| | | |
|---|---|---|
| 2016/0320878 A1 | 11/2016 | Hong et al. |
| 2017/0301742 A1 | 10/2017 | Jeong et al. |
| 2019/0033995 A1 | 1/2019 | Teramoto |
| 2020/0170126 A1 | 5/2020 | Ahn et al. |
| 2021/0175448 A1 | 6/2021 | Ban et al. |
| 2021/0225961 A1 | 7/2021 | Sun et al. |

FOREIGN PATENT DOCUMENTS

| | | |
|---|---|---|
| CN | 110085128 A | 8/2019 |
| CN | 110350014 A | 10/2019 |
| CN | 110459583 A | 11/2019 |
| CN | 110648620 A | 1/2020 |
| CN | 110689810 A | 1/2020 |
| CN | 110783498 A | 2/2020 |
| CN | 111221163 A | 6/2020 |
| CN | 111243442 A | 6/2020 |
| IN | 109860242 A | 6/2019 |
| KR | 20170136951 A | 12/2017 |

\* cited by examiner

DISPLAY PANEL AND CURVED DISPLAY DEVICE

CROSS-REFERENCE TO RELATED APPLICATIONS

The present application is a national phase entry under 35 U.S.C. § 371 of International Application No. PCT/CN2020/140795, filed on Dec. 29, 2020, which claims the priority from Chinese patent application No. 202010176869.7, filed on Mar. 13, 2020, in the China National Intellectual Property Administration, and entitled "Display Panel and Curved Display Device", the entire contents of which are incorporated herein by reference.

FIELD

The present disclosure relates to the field of display, in particular to a display panel and a curved display device.

BACKGROUND

A curved display device is widely applied along with development of a display technology. Generally, the two sides of a display panel of the curved display device are each in a shape of a curved surface with a certain radian. Compared with a traditional flat panel display device, the viewing angles of the curved display device on the left and right side of a screen are larger, thereby providing a better visual experience for a user.

SUMMARY

A display panel provided by an embodiment of the present disclosure, includes:
  a flexible substrate, including a first region and a second region; where
  the first region includes:
  a plurality of light emitting structures, with first opening gaps each formed between two adjacent light emitting structures; and
  a plurality of flexible bridging parts, with at least one flexible bridging part connecting two adjacent light emitting structures.
  Optionally, in the embodiment of the present disclosure, the flexible substrate is substantially in a rectangle shape, and a top corner of the flexible substrate is an arc-shaped angle; and
  the first region includes a region where at least one of four top corners of the flexible substrate is located.
  Optionally, in the embodiment of the present disclosure, the first region has a stretching non-display region, a stretching display region and a transition region, where the transition region is located between the stretching display region and the second region, and the stretching non-display region is located on one side, away from the transition region, of the stretching display region; and
    the stretching display region has the plurality of light emitting structures and the plurality of flexible bridging parts.
  Optionally, in the embodiment of the present disclosure, the plurality of light emitting structures in the stretching display region are arranged in an array; the first opening gaps include a plurality of first sub opening Imps formed at intervals, where a first sub opening gap includes a first gap part extending in a first direction, and a second gap part and a third gap part extending in a second direction;
    every two adjacent rows of light emitting structures serve as a structure row; in a same structure row, two adjacent columns of light emitting structures serve as a first light emitting structure group; in two structure rows sharing a same row of light emitting structures, first light emitting structure groups are staggered; and
    one first light emitting structure group is correspondingly provided with one first sub opening gap, wherein the first gap part is located between the two rows of light emitting structures in the first light emitting structure groups, and the second gap part and the third gap part are located between the two adjacent first light emitting structure groups.
  Optionally, in the embodiment of the present disclosure, the first opening gaps include a plurality of second sub opening gaps formed at intervals, where a second sub opening gap includes a fourth gap part and a fifth gap part extending in the first direction, and a sixth gap part extending in the second direction;
    every two adjacent columns of light emitting structures serve as a structure column; in a same structure column, two adjacent rows of light emitting structures serve as a second light emitting structure group; in two structure columns sharing a same column of light emitting structures, second light emitting structure groups are staggered; and
    one second light emitting structure group is correspondingly provided with one second sub opening gap, where the sixth gap parts is located between the two columns of light emitting structures in the second light emitting structure group, and the fourth gap part and the fifth gap part are located between two adjacent second light emitting structure groups.
  Optionally, in the embodiment of the present disclosure, in the same structure row, one sixth gap part is arranged between first sub opening gaps corresponding to the two adjacent first light emitting structure groups; and
    in the same structure column, one first gap part is arranged between second sub opening gaps corresponding to the two adjacent second light emitting structure groups.
  Optionally, in the embodiment of the present disclosure, the stretching display region further includes a plurality of second opening gaps formed at intervals; and the plurality of second opening gaps are located on one side, facing the transition region, of light emitting structures close to an edge of the stretching display region.
  Optionally, in the embodiment of the present disclosure, a second opening gap includes a seventh gap part extending in the first direction and a eighth gap part extending in the second direction.
  Optionally, in the embodiment of the present disclosure, the stretching non-display region includes a plurality of third opening gaps arrayed at intervals; and at least part of the plurality of third opening gaps extends to an edge of the flexible substrate.
  Optionally, in the embodiment of the present disclosure, a part of the plurality of third opening gaps and the first opening gaps have substantially an equal shape and size; and
    rest of the plurality of third opening gaps except for the part and the second opening gaps have substantially an equal shape and size.
  Optionally, in the embodiment of the present disclosure, the plurality of light emitting structures include at least one first pixel unit, and the at least one first pixel unit includes a first-color sub pixel, a second-color sub pixel and a third-color sub pixel; and the second region includes a plurality of second pixel units, and the plurality of second pixel units include first-color sub pixels, second-color sub pixel pairs and third-color sub pixels, where each second-color sub pixel pair includes two second-color sub pixels.

Optionally, in the embodiment of the present disclosure, a distance between centers of two adjacent light emitting structures in the first direction is greater than or substantially equal to a width of two second pixel units in the first direction.

Optionally, in the embodiment of the present disclosure, a distance between centers of the every two adjacent light emitting structures in the second direction is greater than or substantially equal to a width of four second pixel units in the second direction.

Optionally, in the embodiment of the present disclosure, in one of the at least one first pixel unit, the first-color sub pixel and the third-color sub pixel are arranged on a same row, and the second-color sub pixel is located on a row adjacent to the row where the first-color sub pixel and the third-color sub pixel are located.

Optionally, in the embodiment of the present disclosure, in one of the at least one first pixel unit, an orthographic projection of a center of the second-color sub pixel on a connecting line between a center of the first-color sub pixel and a center of the third-color sub pixel is located between the center of the first-color sub pixel and the center of the third-color sub pixel.

Optionally, in the embodiment of the present disclosure, in one of the at least one first pixel unit, the first-color sub pixel and the second-color sub pixel are arranged on a same column, and the third-color sub pixel is located on a column adjacent to the column where the first-color sub pixel and the second-color sub pixel are located.

Optionally, in the embodiment of the present disclosure, in one of the at least one first pixel unit, an orthographic projection of the center of the third-color sub pixel on a connecting line between the center of the first-color sub pixel and the center of the second-color sub pixel is located between the center of the first-color sub pixel and the center of the second-color sub pixel.

Optionally, in the embodiment of the present disclosure, in the at least one first pixel units, a light emitting area of the third-color sub pixel is greater than a light emitting area of the first-color sub pixel and a light emitting area of the second-color sub pixel.

Optionally, in the embodiment of the present disclosure, in the at least one first pixel unit, the light emitting area of the first-color sub pixel is greater than or substantially equal to the light emitting area of the second-color sub pixel.

Optionally, in the embodiment of the present disclosure, in the first region, an arrangement of sub pixels in each of the at least one first pixel unit is equal.

Optionally, in the embodiment of the present disclosure, the transition region includes at least one third pixel unit; and the at least one third pixel remit includes a first-color sub pixel, a second-color sub pixel and a third-color sub pixel: and
  a pixel distribution density in the transition region is smaller than a pixel distribution density in the second region, and
  the pixel distribution density in the transition region is greater than or substantially equal to a pixel distribution density in the stretching display region.

Optionally, in the embodiment of the present disclosure, an arrangement of sub pixels in each of the plurality of second pixel units and the arrangement of sub pixels in each of the at least one first pixel unit are equal.

Optionally, in the embodiment of the present disclosure, the sub pixels in the first region and some of the sub pixels in the second region are located on a same row; and/or
  the sub pixels in the stretching display region and some of the sub pixels in the second region are located on a same column.

Optionally, in the embodiment of the present disclosure, the first region further includes a plurality of first scanning lines, where the sub pixels located on one row in the first region are electrically connected with one first scanning line; and
  the transition region includes a first gate driving circuit, where the first gate driving circuit is electrically connected with the plurality of first scanning lines, and configured to drive the plurality of first scanning lines.

Optionally, in the embodiment of the present disclosure, the second region includes a first conventional region and a second conventional region arrayed in the second direction, where the first conventional region and the first region are arrayed in the first direction; and
  the first conventional region includes a plurality of second scanning lines, where one row of the second pixel units is electrically connected with one second scanning line, and the first gate driving circuit is further electrically connected with the plurality of second scanning lines, and configured to drive the plurality of second scanning lines.

Optionally, in the embodiment of the present disclosure, for a first scanning line and a second scanning line electrically connected with the sub pixels located on a same row in the first region and the first conventional region, the first scanning line and the second scanning line are electrically connected with a same shift register in the first gate driving circuit.

Optionally, in the embodiment of the present disclosure, a light emitting area of one first-color sub pixel in the stretching display region is greater than or substantially equal to a light emitting area of one first-color sub pixel in the transition region;
  a light emitting area of one second-color sub pixel in the stretching display region is greater than or substantially equal to a light emitting area of one second-color sub pixel in the transition region; and
  a light emitting area of one third-color sub pixel in the stretching display region is greater than or substantially equal to a light emitting area of one third-color sub pixel in the transition region.

Optionally, in the embodiment of the present disclosure, a light emitting area of one first-color sub pixel in the transition region is greater than or substantially equal to a light emitting area of one first-color sub pixel in the second region;
  a light emitting area of one second-color sub pixel in the transition region is greater than or substantially equal to a light emitting area of one second-color sub pixel in the second region; and
  a light emitting area of one third-color sub pixel in the transition region is greater than or substantially equal to a light emitting area of one third-color sub pixel in the second region.

Optionally, in the embodiment of the present disclosure, in the second region, the second pixel units in the two adjacent rows are staggered.

A curved display device provided by an embodiment of the present disclosure, includes the above display panel.

DETAILED DESCRIPTION OF THE EMBODIMENTS

Figure 1:
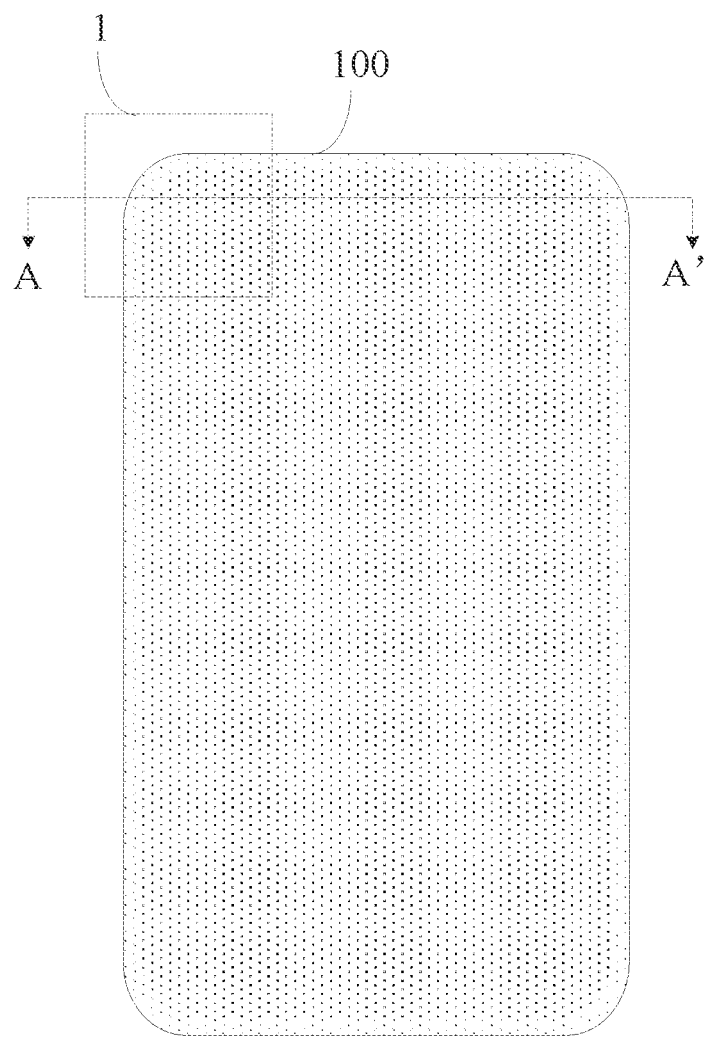
FIG. 1 is a schematic structural diagram of a display panel in some embodiments of the present disclosure.

In order to make the objective, technical solutions and advantages of the embodiments of the present disclosure clearer, the technical solutions of the embodiments of the present disclosure will be described clearly and completely with reference to the drawings of the embodiments of the present disclosure. Obviously, the described embodiments are part of the embodiments of the present disclosure, but not all the embodiments. The embodiments in the present disclosure and characteristics in the embodiments may be mutually combined in the case of no conflict. On the basis of the described embodiments of the present disclosure, all other embodiments obtained by a person of ordinary skill in the art without inventive efforts fall within the protection scope of the present disclosure.

Unless otherwise defined, the technical or scientific terms used in the present disclosure shall have the usual meanings understood by a person of ordinary skill in the art to which the present disclosure belongs. The words "first", "second" and the like used in the present disclosure do not indicate any order, quantity or importance, but are only used to distinguish different components. The word "including" or "comprising" and the like, means that an element or item preceding the word comprises an element or item listed after the word and the equivalent thereof, without excluding other elements or items. The word "connection" or "coupling" and the like is not restricted to physical or mechanical connection, but may include electrical connection, whether direct or indirect.

It should be noted that the size and shapes of all graphs in the drawings do not reflect the true scale, and only intend to illustrate the content of the present disclosure. The same or similar reference numbers throughout the present disclosure represent the same or similar elements or elements with the same or similar functions.

Generally, the two sides of a display panel of a curved display device are each in a shape of a curved surface with a certain radian. Compared with a traditional flat panel display device, the viewing angles of the curved display device on the left and right side of a screen are larger, thereby providing a better visual experience for a user. In actual application, a curved display device is generally manufactured by bending a mold directly to fit the flexible display panel to a package substrate to form the curved display device.

Figure 2:
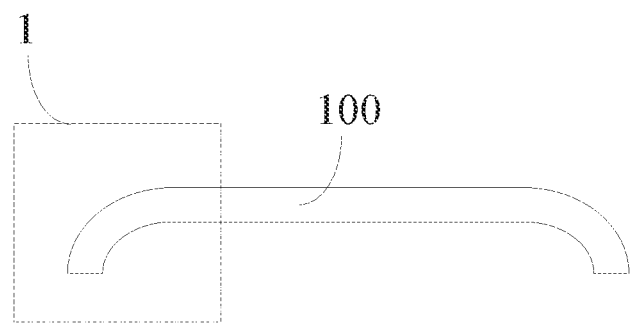
FIG. 2 is a schematic diagram of a sectional structure of the display panel as shown in FIG. 1 in a direction AA' in some embodiments of the present disclosure.
Figure 3:
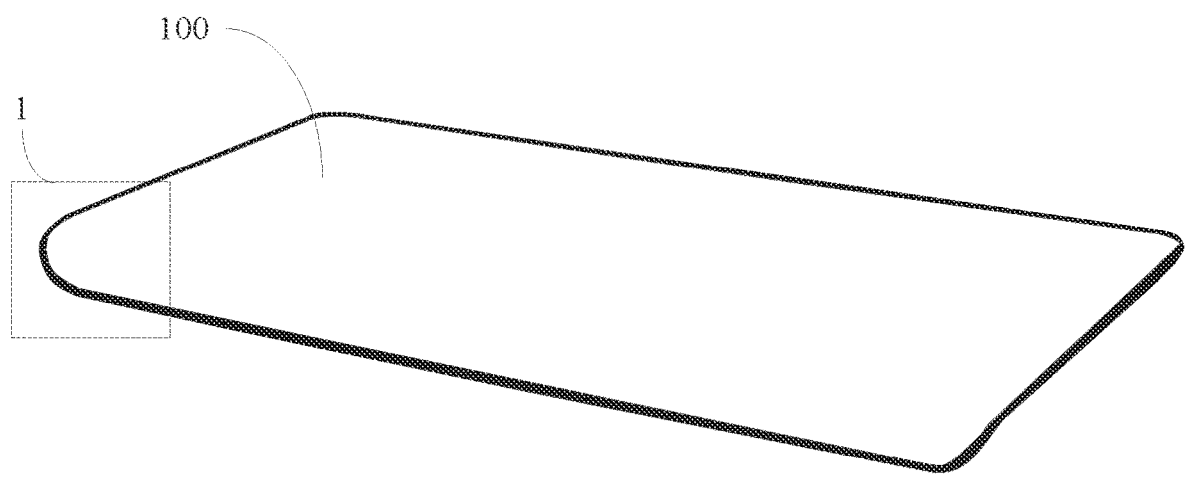
FIG. 3 is a schematic diagram of a stereo structure of a display panel in some embodiments of the present disclosure.

As shown in FIG. 1 to FIG. 3, the display panel 100 is generally and roughly in a rectangle shape. After the flexible display panel has been bonded to the three-dimensional (3D) package substrate, a region 1 where four top corners of the display panel are located may be bent to result in stress concentration, further leading to the wrinkle phenomenon prone to occurring in the region 1 where the four top corners are located.

Figure 4:
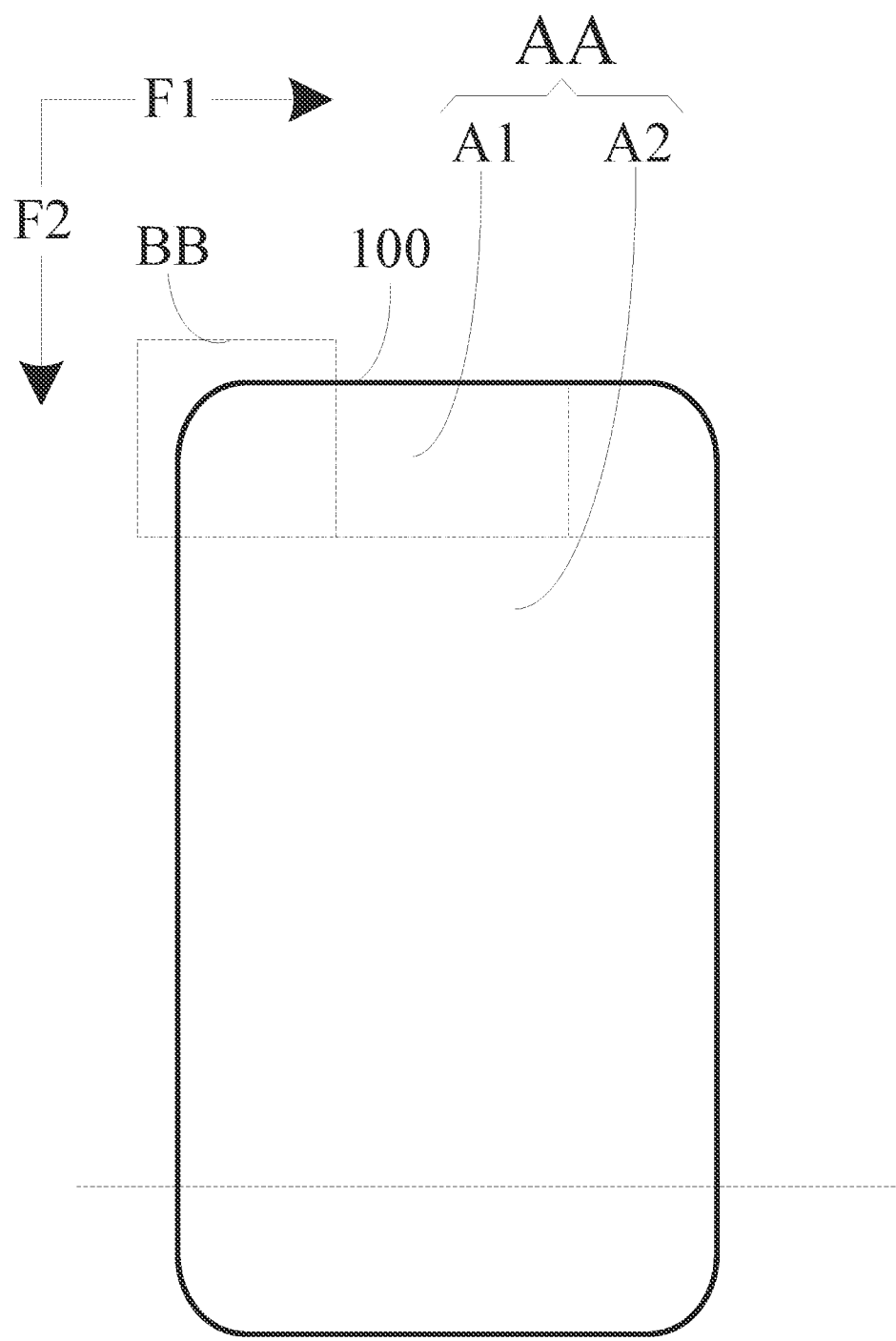
FIG. 4 is another schematic structural diagram of the display panel in some embodiments of the present disclosure.
Figure 5:
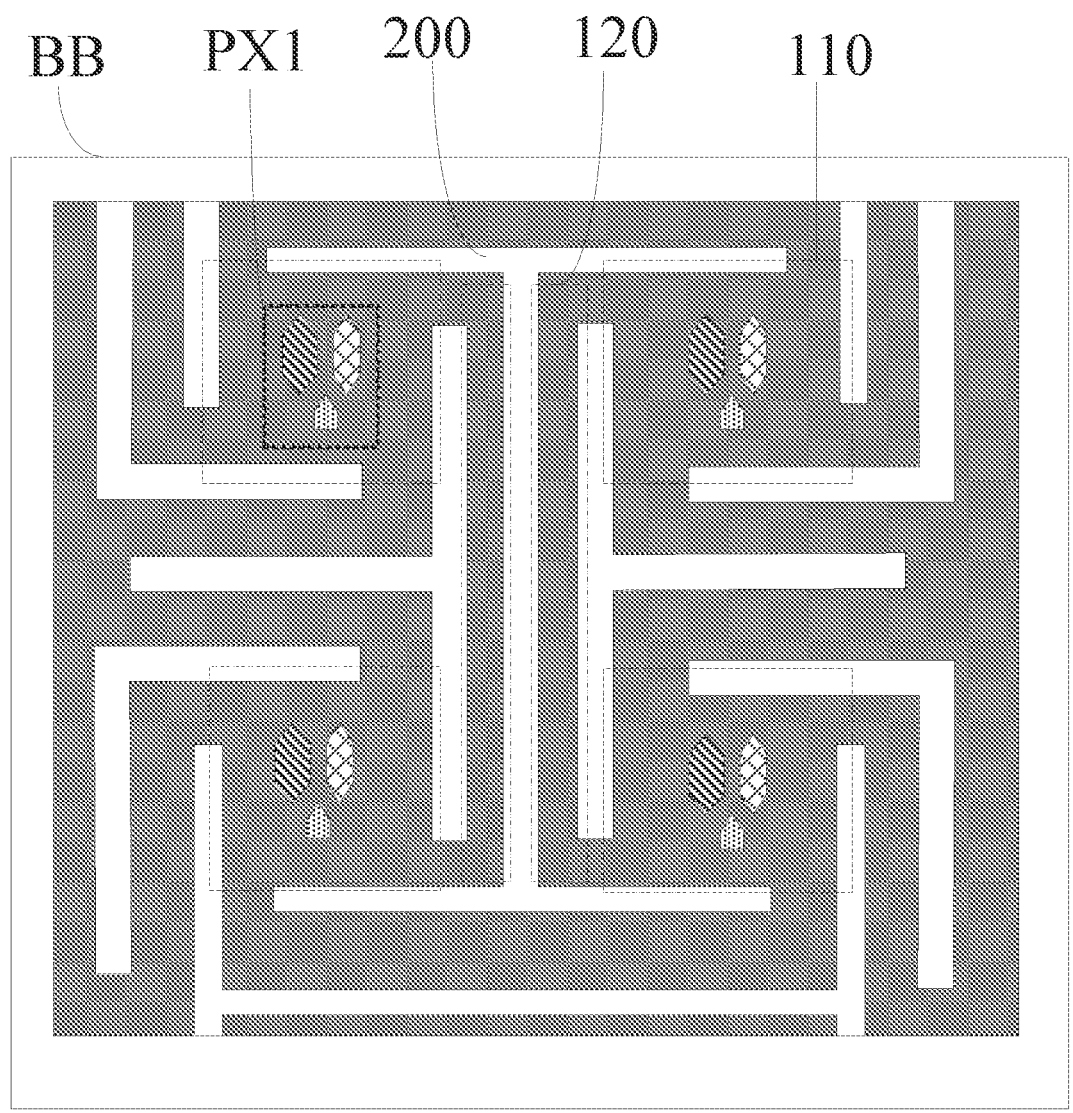
FIG. 5 is a schematic structural diagram of a first region in the display panel in some embodiments of the present disclosure.

In view of above, a display panel provided by an embodiment of the present disclosure, as shown in FIG. 4 and FIG. 5, may include:

a flexible substrate 100, including a flexible first region BB and a flexible second region AA, where the first region BB includes:

a plurality of light emitting structures 110 with first opening gaps 200 each between two adjacent light emitting structures 110; and a plurality of flexible bridging parts 120, with at least one flexible bridging part 120 connecting two adjacent light emitting structures 110.

According to the display panel provided by the embodiment of the present disclosure, the flexible substrate may be designed in a zoning mode by enabling the flexible substrate to include the first region and the second region. The first region may include: the plurality of light emitting structures and the plurality of flexible bridging parts. Because the flexible bridging parts have good flexible performance, and the every two adjacent light emitting structures may be connected through the at least one flexible bridging part, the light emitting structures may be mutually connected. Moreover, a space between the light emitting structures may be arranged to be of a hollowed-out structure by forming the first opening gap between the every two adjacent light emitting structures. Thus when stresses occur in the first region during bending, they may be released through the first opening gap to reduce the stress effect. Therefore, after the display panel has been bonded to the 3D package substrate, the stress effect can be reduced, and a quadrilateral stereo display form is realized.

Moreover, since the flexible bridging parts 120 have the good flexible performance, the every two adjacent light emitting structures 110 may be connected through the at least one flexible bridging part 120, and the light emitting structures 110 in the first region BB may be stretched through the flexible bridging parts 120, so that the flexible substrate 100 in the first region BB may be arranged to be of a stretchable structure to further reduce the influence of the stress. In this way, after the display panel has been bonded to the 3D package substrate, the stress effect can be reduced, and the quadrilateral stereo display form is realized.

In specific implementation, in the embodiment of the present disclosure, as shown in FIG. 4, the flexible substrate 100 may be roughly arranged in a rectangle shape, that is, a continuous region, formed by the first region BB and the second region AA form, is roughly in the rectangle shape. For example, complementary shapes may be formed by the first region BB and the second region AA to form the continuous region. Exemplarily, for example, a top corner of the flexible substrate 100 may be arranged to be an arc-shaped angle. It should be noted that because the top corners of a rectangle are generally right angles, but in the present disclosure, the flexible substrate 100 is arranged to be the rectangle with the top corners being the arc-shaped angles, the flexible substrate 100 in the present disclosure is roughly in the rectangle shape.

In specific implementation, in the embodiment of the present disclosure, as shown in FIG. 4, the first region BB includes a region where the at least one of the four top corners of the flexible substrate 100 is located. For example, the first region BB may be arranged to be the region where each of the four top corners of the flexible substrate 100 is located. Exemplarily, a region where one of the four top corners of the flexible substrate 100 is located is the region 1, for example, as shown in FIGS. 1-3.

In the embodiment of the present disclosure, the light emitting structures 110 and the flexible bridging parts 120 are arranged in the region where each of the four top corners of the flexible substrate 100 is located, in this way, when stresses occur in the region where each of the four top corners of the flexible substrate 100 is located during bending, they may be released through the first opening gaps 200 to reduce the stress effect. Therefore, after the display panel in the embodiment of the present disclosure has been bonded to the 3D package substrate, the stress effect can be reduced, and the quadrilateral stereo display form is realized.

In specific implementation, in the embodiment of the present disclosure, as shown in FIG. 5, the first opening gap 200 is formed to be of a hollowed-out structure in the flexible substrate 100. For example, a region corresponding to the first opening gap 200 in the flexible substrate 100 may be removed by adopting a composition technology, or a laser cutting technology.

In specific implementation, in the embodiment of the present disclosure, the flexible substrate 100 may be made of a polyimide (PI) material. Certainly, in actual application, the flexible substrate 100 may also be made of other materials capable of realizing the flexible substrate 100, which can be designed and determined according to needs of the actual application and is not limited here.

Figure 6:
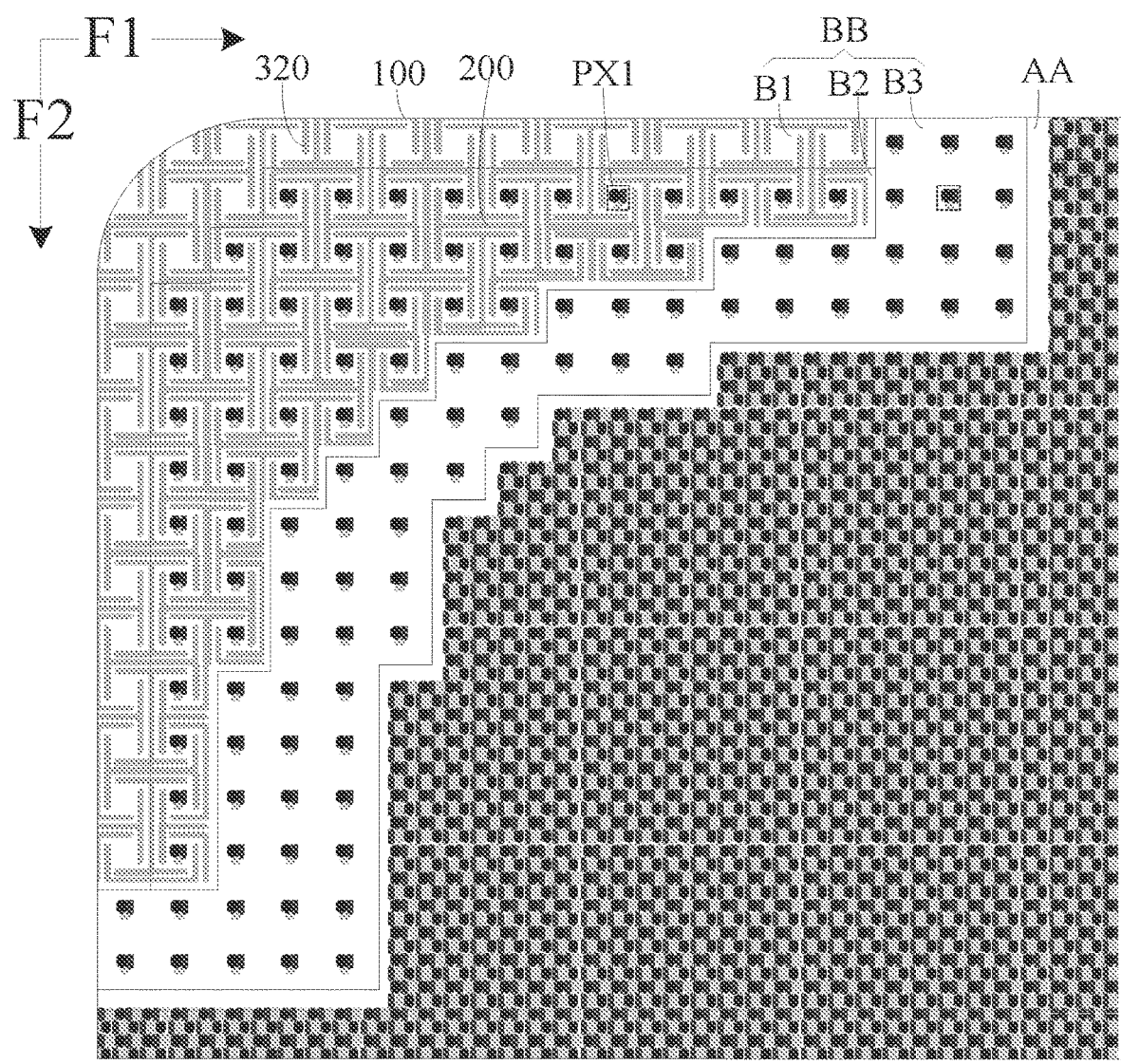
FIG. 6 is a schematic diagram of some local structures in the display panel in some embodiments of the present disclosure.
Figure 7:
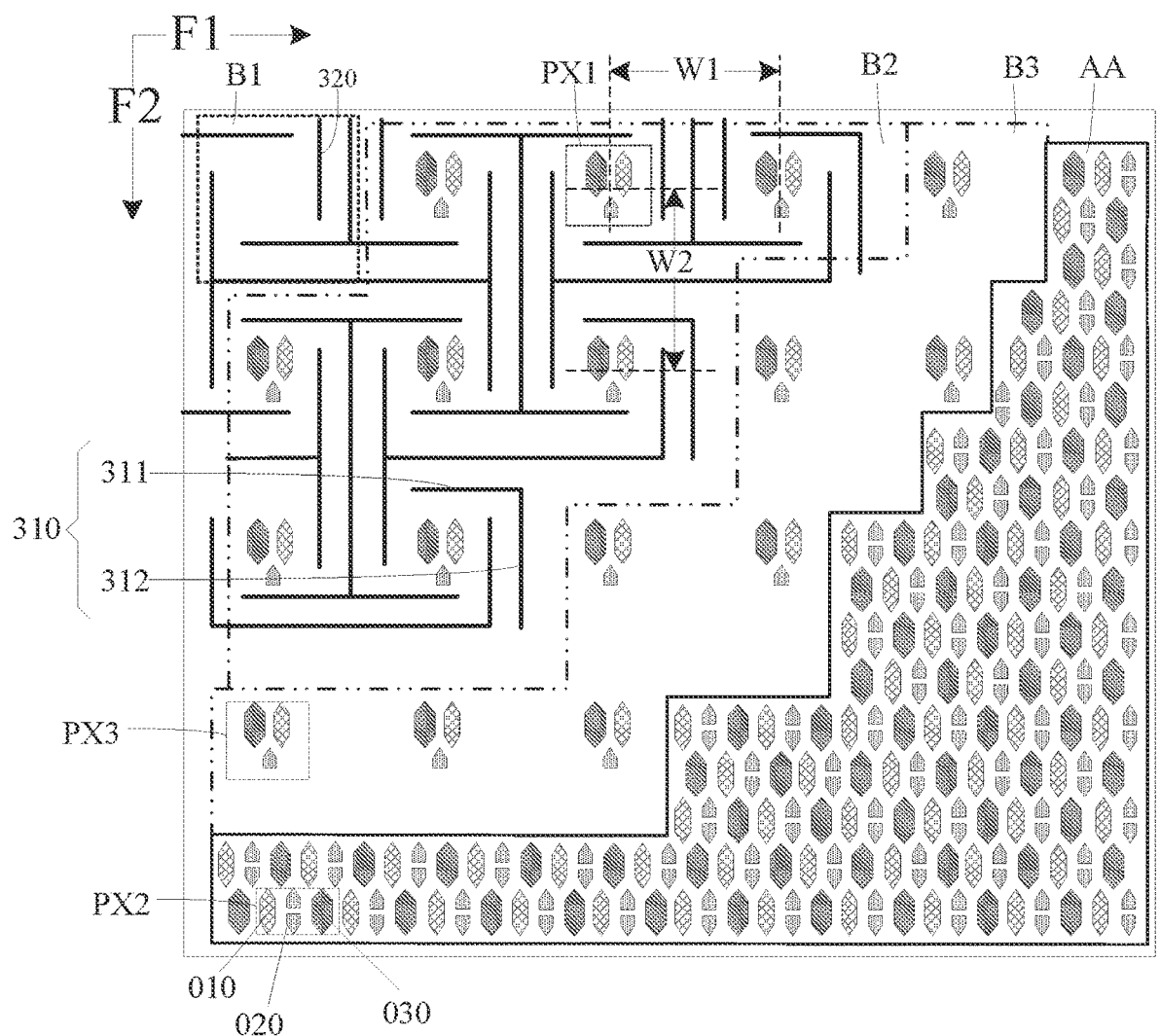
FIG. 7 is a schematic diagram of some other local structures in the display panel in some embodiments of the present disclosure.
Figure 8:
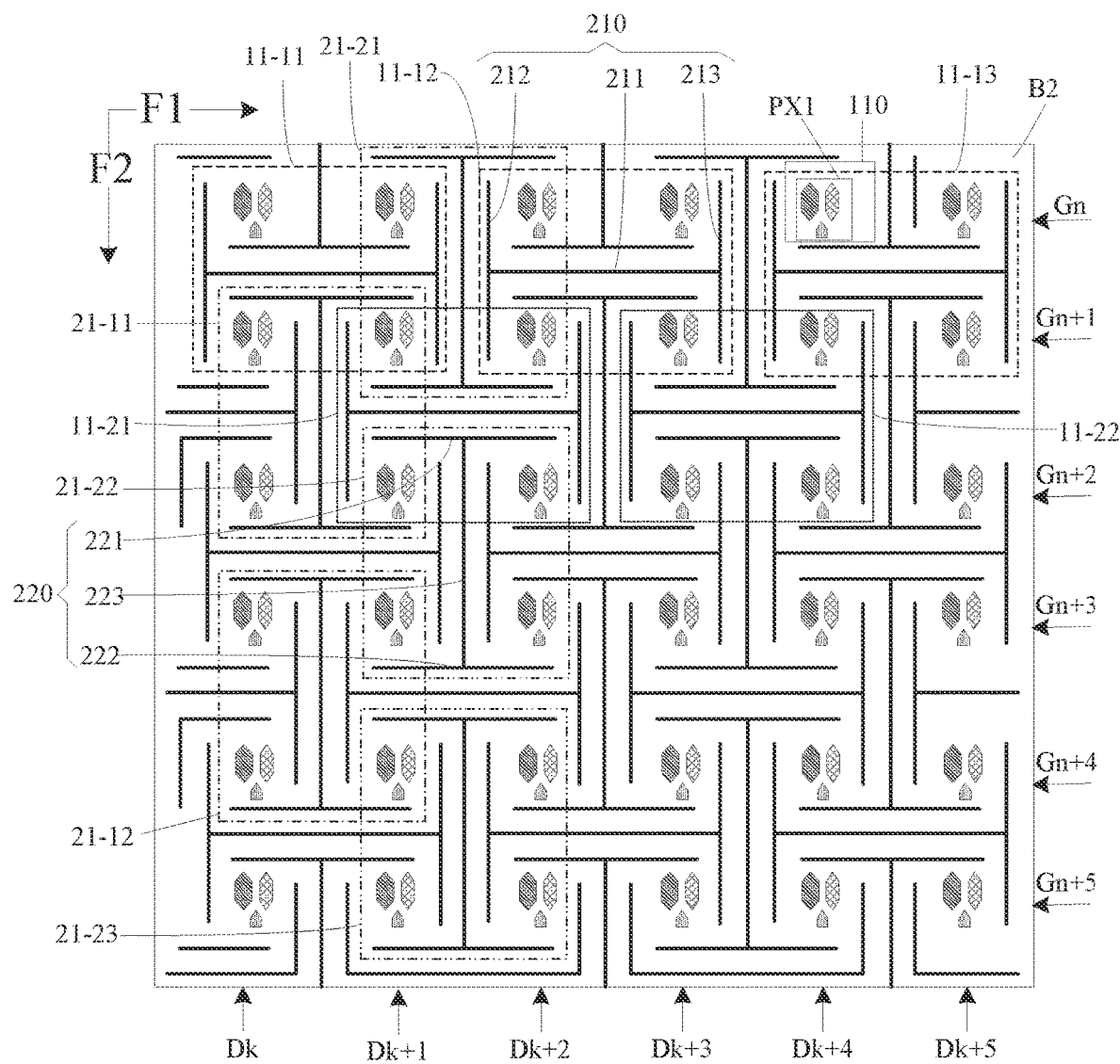
FIG. 8 is a schematic diagram of some structures of a stretching display region in the display panel in some embodiments of the present disclosure.

In specific implementation, in the embodiment of the present disclosure, as shown in FIG. 6 to FIG. 8, the first region BB may include: a stretching non-display region B1, a stretching display region B2 and a transition region B3. The transition region B3 is located between the stretching display region B2 and the second region AA, and the stretching non-display region B1 is located on one side, away from the transition region B3, of the stretching display region B2. The stretching non-display region B1 may be formed with only the plurality of flexible bridging parts 120 and the opening gaps, and not provided with the light emitting structures. Moreover, the stretching display region B2 is formed with the plurality of light emitting structures 110 and the plurality of flexible bridging parts 120. In this way, the plurality of light emitting structures 110 and the plurality of flexible bridging parts 120 may be arranged in the stretching display region B2. In addition, the transition region B3 is arranged between the stretching display region B2 and the second region AA and is not internally provided with the opening gaps to avoid the impact of the opening gaps on the second region AA.

Exemplarily, as shown in FIG. 6, the stretching non-display region B1 and the stretching display region B2 may be roughly arc-shaped regions. In actual application, pixel units may be arranged in the display panel and generally distributed in an array, and therefore, the stretching non-display region B1 and the stretching display region B2 cannot be the arc-shaped regions in the general sense. Furthermore, in an actual technology, the stretching non-display region B1 and the stretching display region B2 cannot be arranged to be the arc-shaped regions in the general sense due to limitation of technological conditions or other factors. Therefore, the stretching non-display region B1 and the stretching display region B2 may be arranged to be the arc-shaped regions only by roughly meeting the above conditions, which all fall within the protection scope of the present disclosure.

In specific implementation, in the embodiment of the present disclosure, as shown in FIG. 6 to FIG. 8, the light emitting structure 110 may include at least one first pixel unit PX1. Exemplarily, the light emitting structure 110 may include the plurality of first pixel units PX1 or one first pixel unit PX1. In actual application, it may be designed and determined according to needs of the actual application, which is not limited here. Illustration is made below by taking an example that one first pixel unit PX1 is arranged in the light emitting structure 110.

In specific implementation, in the embodiment of the present disclosure, as shown in FIG. 6 to FIG. 8, the light emitting structures 110 in the stretching display region B2 may be arranged in an array. In this way, the light emitting structures 110 may be uniformly arrayed in the stretching display region B2 to improve display uniformity of the stretching display region B2.

In specific implementation, in the embodiment of the present disclosure, as shown in FIG. 8, the first opening gap 200 may include a plurality of first sub opening gaps 210 formed at intervals. One first sub opening gap 210 may include: a first gap part 211 extending in a first direction F1, and a second gap part 212 and a third gap part 213 extending in a second direction F2. Moreover, in the same first sub opening gap 210, the first gap part 211, the second gap part 212 and the third gap part 213 are mutually conducted, Every two adjacent rows of light emitting structures 110 serve as a structure row; in the same structure row, every two adjacent columns of light emitting structures 110 serve as a first light emitting structure group; and the first light emitting structure groups are staggered in every two structure rows sharing the same row of light emitting structures. Exemplarily, FIG. 8 shows the six rows of light emitting structures, e.g., the $n^{th}$ row of light emitting structures Gn to the $(n+5)^{th}$ row of light emitting structures Gn+5. FIG. 8 further shows the six columns of light emitting structures, e.g., the $k^{th}$ column of light emitting structures Dk to the $(k+5)^{th}$ column of light emitting structures Dk+5. The $n^{th}$ row of light emitting structures Gn and the $(n+5)^{th}$ row of light emitting structures Gn+1 may constitute the first structure row, the $(n+5)^{th}$ row of light emitting structures Gn+5 and the $(n+2)^{th}$ row of light emitting structures Gn+2 may constitute the second structure row, the $(n+2)^{th}$ row of light emitting structures Gn+2 and the $(n+3)^{th}$ row of light emitting structures Gn+3 may constitute the third structure row, the $(n+3)^{th}$ row of light emitting structures Gn+3 and the $(n+4)^{th}$ row of light emitting structures Gn+4 may constitute the fourth structure row, and the $(n+4)^{th}$ row of light emitting structures Gn+4 and the $(n+5)^{th}$ row of light emitting structures Gn+5 may constitute the fifth structure row. It should be noted that n and k may be an integer. In actual application, specific numerical values of n and k may be designed and determined according to needs of the actual application and are not limited here.

In the first structure row formed by the $n^{th}$ row of light emitting structures Gn and the $(n+1)^{th}$ row of light emitting structures Gn+1, the $k^{th}$ column of light emitting structures Dk and the $(k+1)^{th}$ column of light emitting structures Dk+1 may constitute one first light emitting structure group 11-11, the $(k+2)^{th}$ column of light emitting structures Dk+2 and the $(k+3)^{th}$ column of light emitting structures Dk+3 may constitute one first light emitting structure group 11-12, and the $(k+4)^{th}$ column of light emitting structures Dk+4 and the $(k+5)^{th}$ column of light emitting structures Dk+5 may constitute one first light emitting structure group 1143. In the second structure row formed by the $(n+1)^{th}$ row of light emitting structures Gn+1 and the $(n+2)^{th}$ row of light emitting structures Gn+2, the $(k+1)^{th}$ column of light emitting structures Dk+1 and the $(k+2)^{th}$ column of light emitting structures Dk+2 may constitute one first light emitting structure group 11-21, and the $(k+3)^{th}$ column of light emitting structures Dk+3 and the $(k+4)^{th}$ column of light emitting structures Dk+4 may constitute one first light emitting structure group 11-22. The first light emitting structure group 1141, the first light emitting structure group 1142 and the first light emitting structure group 11-13 are sequentially arrayed in the first direction F1, and the first light emitting structure group 11-21 and the first light emitting structure group 11-22 are also sequentially arrayed in the first direction F1. The first light emitting structure group 11-21 is staggered with the first light emitting structure group 11-11 and the first light emitting structure group 11-12, that is, the first light emitting structure group 11-21 and the first light emitting structure group 11-11 share one light emitting structure 110, and the first light emitting structure group 11-21 and the first light emitting structure group 11-12 also share one light emitting structure 110. The first light emitting structure group 11-22 is staggered with the first light emitting structure group 11-12 and the first light emitting structure group 11-13. That is, the first light emitting structure group 11-22 and the first light emitting structure group 11-12 share one light emitting structure 110, and the first light emitting structure group 11-22 and the first light emitting structure group 11-13 also share one light emitting structure 110. The rest, followed so on, is not repeated here.

In specific implementation, in the embodiment of the present disclosure, as shown in FIG. 8, one first light emitting structure group may be correspondingly provided with one first sub opening gap 210, the first gap parts 211 are located between the two rows of light emitting structures 110 in the first light emitting structure groups, and the second gap parts 212 and the third gap parts 213 are located between the two adjacent first light emitting structure groups. Exemplarily, each of the first light emitting structure groups 11-11, 11-12, 11-13, 11-21 and 11-22 is correspondingly provided with one first sub opening gap 210. Taking the first light emitting structure group 11-12 as an example, the first gap part 211 is located between the two rows of light emitting structures 110 in the first light emitting structure group 11-12, the second gap part 212 is located between the first light emitting structure group 11-11 and the first light emitting structure group 11-12, and the third gap part 213 is located between the first light emitting structure group 11-12 and the first light emitting structure group 11-13. The rest, followed so on, is not repeated here. In this way, as for the two structure rows sharing the same row of light emitting structures, the first sub opening gaps 210 formed in the two structure rows may be staggered.

In specific implementation, in the embodiment of the present disclosure, as shown in FIG. 8, the first opening gap 200 includes a plurality of second sub opening gaps 220 formed at intervals. One second sub opening gap 220 includes a fourth gap part 221 and a fifth gap part 222 extending in the first direction F1, and a sixth gap part 223 extending in the second direction F2. Moreover, every two adjacent columns of light emitting structures 110 serve as a structure column; in the same structure column, every two adjacent rows of light emitting structures 110 serve as a second light emitting structure group; and the second light emitting structure groups are staggered in every two structure columns sharing the same column of light emitting structures. Exemplarily, as shown in FIG. 8, the $k^{th}$ column of light emitting structures Dk and the $(k+1)^{th}$ column of light emitting structures Dk+1 may constitute the first structure column, the $(k+1)^{th}$ column of light emitting structures Dk+1 and the $(k+2)^{th}$ column of light emitting structures Dk+2 may constitute the second structure column, the $(k+2)^{th}$ column of light emitting structures Dk+2 and the $(k+3)^{th}$ column of light emitting structures Dk+3 may constitute the third structure column, and the $(k+3)^{th}$ column of light emitting structures Dk+3 and, the $(k+4)^{th}$ column of light emitting structures Dk+4 may constitute the fourth structure column, and the $(k+4)^{th}$ column of light emitting structures Dk+4 and the $(k+5)^{th}$ column of light emitting structures Dk+5 may constitute the fifth structure column.

In the first structure column formed by the $k^{th}$ column of light emitting structures Dk and the $(k+1)^{th}$ column of light emitting structures Dk+1, the $(n+1)^{th}$ row of light emitting structures Gn+1 and the $(n+2)^{th}$ row of light emitting structures Gn+2 may constitute one second light emitting structure group 21-11, and the $(n+3)^{th}$ row of light emitting structures Gn+3 and the $(n+4)^{th}$ row of light emitting structures Gn+4 may constitute one second light emitting structure group 21-12. In the second structure column formed by the $(k+1)^{th}$ column of light emitting structures Dk+1 and the $(k+2)^{th}$ column of light emitting structures Dk+2, the $n^{th}$ row of light emitting structures GES and the $(n+1)^{th}$ row of light emitting structures Gn+1 may constitute one second light emitting structure group 21-21, the $(n+2)^{th}$ row of light emitting structures Gn+2 and the $(n+3)^{th}$ row of light emitting structures Gn+3 may constitute one second light emitting structure group 21-22, and the $(n+4)^{th}$ row of light emitting structures Gn+4 and the $(n+5)^{th}$ row of light emitting structures Gn+5 may constitute one second light emitting structure group 21-23. The second light emitting structure group 21-11 and the second light emitting structure group 21-12 are sequentially arrayed in the second direction F2, and the second light emitting structure group 21-21, the second light emitting structure group 21-22 and the second light emitting structure group 21-23 are also sequentially arrayed in the second direction F2. The second light emitting structure group 21-11 is staggered with the second light emitting structure group 21-21 and the second light emitting structure group 21-22, that is, the second light emitting structure group 21-11 and the second light emitting structure group 21-21 share one light emitting structure 110, and the second light emitting structure group 21-11 and the second light emitting structure group 21-22 also share one light emitting structure 110. The second light emitting structure group 21-12 is staggered with the second light emitting structure group 21-22 and the second light emitting structure group 21-23. That is, the second light emitting structure group 21-12 and the second light emitting structure group 21-22 share one light emitting structure 110, and the second light emitting structure group 21-12 and the second light emitting structure group 21-23 also, share one light emitting structure 110. The rest, followed so on, is not repeated here.

In specific implementation, in the embodiment of the present disclosure, as shown in FIG. 8, one second light emitting structure group may be correspondingly provided with one second sub opening gap 220. The sixth gap parts 223 are located between the two columns of light emitting structures in the second light emitting structure groups, and the fourth gap parts 221 and the fifth gap parts 222 are located between the two adjacent second light emitting structure groups. Exemplarily, each of the second light emitting structure groups 21-11, 21-12, 21-21, 21-22 and 21-23 is correspondingly provided with one second sub opening gap 220. Taking the second light emitting structure group 21-22 as an example, the sixth gap part 223 is located between the two columns of light emitting structures in the second light omitting structure group 21-22, the fourth gap part 221 is located between the second light emitting structure group 21-21 and the second light emitting structure group 21-22, and the fifth gap part 222 is located between the second light emitting structure group 21-22 and the second light emitting structure group 21-23. The rest, followed so on, is not repeated here. In this way, as for the two structure columns sharing the same column of light emitting structures, the second sub opening gaps 220 formed in the two structure columns may be staggered.

In specific implementation, in the embodiment of the present disclosure, as shown in FIG. 8, in the same structure row, one sixth gap part 223 may be arranged between the first sub opening gaps 210 corresponding to the two adjacent first light emitting structure groups. Exemplarily, as shown in FIG. 8, in the first structure row, one sixth gap part 223 may be arranged between the first sub opening gap 210 corresponding to the first light emitting structure group 11-11 and the first sub opening gap 210 corresponding to the first light emitting structure group 11-12. One sixth gap part 223 may also be arranged between the first sub opening gap 210 corresponding to the first light emitting structure group 11-12 and the first sub opening gap 210 corresponding to the first light emitting structure group 11-13. In the second structure row, one sixth gap part 223 may be arranged between the first sub opening gap 210 corresponding to the first light emitting structure group 11-21 and the first sub opening gap 210 corresponding to the first light emitting structure group 11-22. The rest, followed so on, is not repeated here.

In specific implementation, in the embodiment of the present disclosure, as shown in FIG. 8, in the same structure column, one first gap part 211 may be arranged between the second sub opening gaps 220 corresponding to the two adjacent second light emitting structure groups. Exemplarily, as shown in FIG. 8, in the first structure column, one first gap part 211 may be arranged between the second light emitting structure group 21-11 and the second light emitting structure group 21-12. In the second structure column, one first gap part 211 may be arranged between the second light emitting structure group 21-21 and the second light emitting structure group 21-22. One first gap part 211 may also be arranged between the second light emitting structure group 21-22 and the second light emitting structure group 21-23. The rest, followed so on, is not repeated here.

In specific implementation, in the embodiment of the present disclosure, as shown in FIG. 8, the first sub opening gaps 210 and the second sub opening gaps 220 may be repeatedly and uniformly distributed to improve display uniformity.

In specific implementation, in the embodiment of the present disclosure, as shown in FIG. 7, the stretching display region B2 may further include a plurality of second opening gaps 310 formed at intervals; and the second opening gaps 310 are located on one side, facing the transition region B3, of the light emitting structures 110 close to an edge of the stretching display region B2. Exemplarily, as shown in FIG. 7, the second opening gap 310 includes a seventh gap part 311 extending in the first direction F1 and an eighth gap part 312 extending in the second direction F2. In this way, the light emitting structures 110 and the transition region B3 can be spaced through the second opening gaps 310 to avoid the impact of the stress on the first region BB through the transition region B3.

In specific implementation, in the embodiment of the present disclosure, as shown in FIG. 7, the second opening gap 310 is also provided as a hollowed-out structure in the flexible substrate 100. For example, a region corresponding to the second opening gap 310 in the flexible substrate 100 may be removed by adopting a composition technology, or a laser cutting technology.

In specific implementation, in the embodiment of the present disclosure, the first direction F1 may be the row direction of the sub pixels, and the second direction F2 may be the column direction of the sub pixels. Alternatively, the first direction F1 may also be the column direction of the sub pixels, and the second direction F2 may be the row direction of the sub pixels, which may be designed and determined according to needs of the actual application and is not limited here.

In order to the package the display panel, a blocking part and a thin film packaging layer located on the flexible substrate 100 are further arranged in the first region BB. An orthographic projection of the blocking part on the flexible substrate 100 surrounds the light emitting structures 110 and the flexible bridging parts 120. A region surrounded by an orthographic projection of the thin film packaging layer on the flexible substrate 100 covers second pixel units PX2 in the light emitting structures 110 and signal lines in the flexible bridging parts 120 and covers the orthographic projection of the blocking part on the flexible substrate 100. In this way, the light emitting structures 110 may be packaged.

Figure 9:
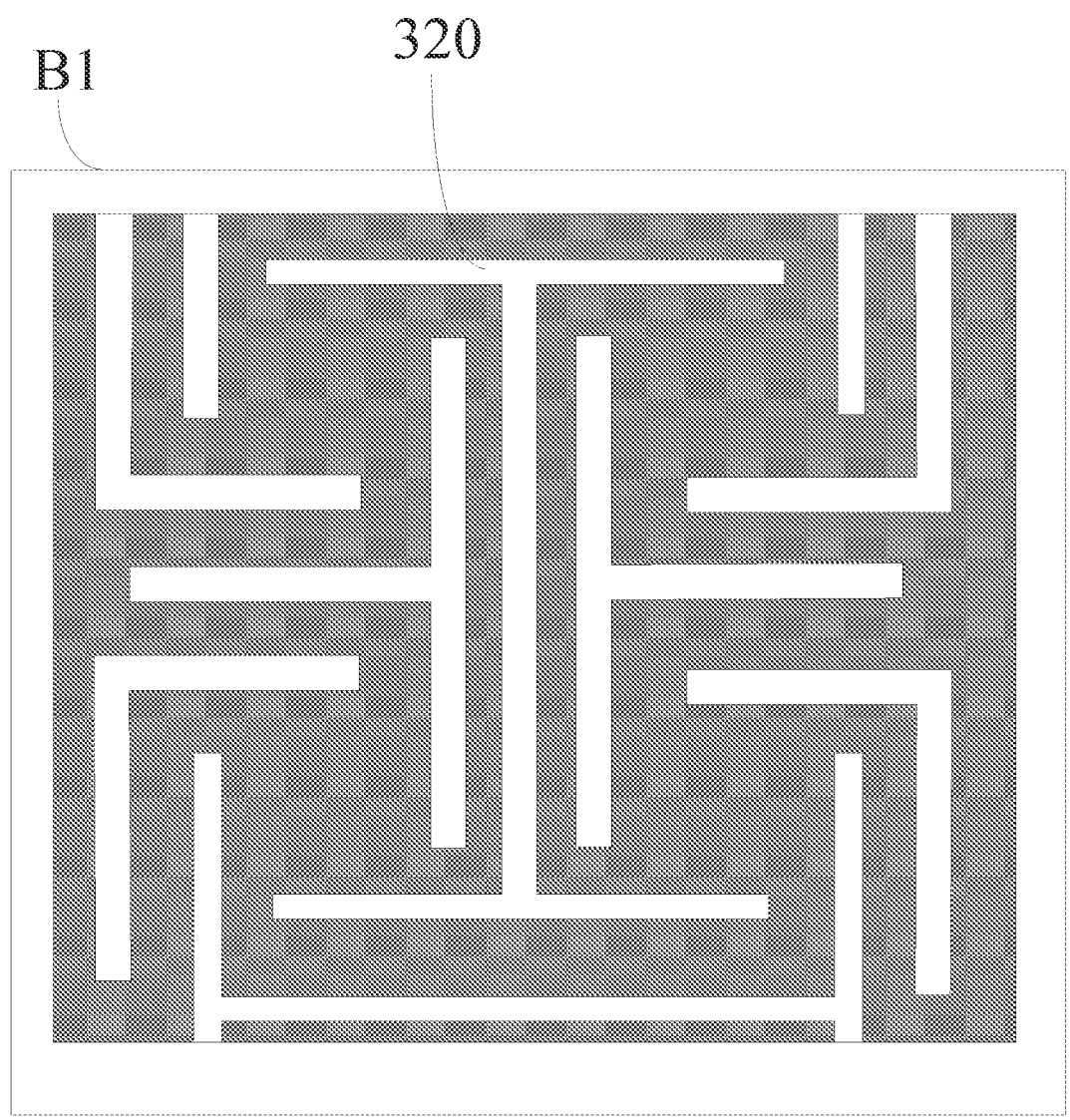
FIG. 9 is a schematic diagram of some structures of a stretching non-display region in the display panel in some embodiments of the present disclosure.

In specific implementation, in the embodiment of the present disclosure, as shown in FIGS. 6, 7 and 9, the stretching non-display region B1 may include a plurality of third opening gaps 320 arrayed at intervals, and at least part of the third opening gaps 320 extend to an edge of the flexible substrate 100. Exemplarily, as shown in FIGS. 6, 7 and 9, the part of the third opening gaps 320 may not extend to the edge of the flexible substrate 100 and be arranged in the flexible substrate 100 in the stretching non-display region B1. The rest of the third opening gaps 320 extend to the edge of the flexible substrate 100 to further reduce the stress effect.

In specific implementation, in the embodiment of the present disclosure, as shown in FIG. 9, the third opening gap 320 may also be provided as a hollowed-out structure in the flexible substrate 100. For example, a region corresponding to the third opening gap 320 in the flexible substrate 100 may be removed by adopting a composition technology, or a laser cutting technology.

In specific implementation, in the embodiment of the present disclosure, as shown in FIGS. 6, 7 and 9, a part of third opening gaps 320 may be roughly the same as the first opening gaps 200 in shape and size. In this way, the part of the third opening gaps 320 may be formed according to an arraying mode of the first opening gaps 200 in the stretching display region B2 to reduce the technological setting difficulty.

In specific implementation, in the embodiment of the present disclosure, as shown in FIGS. 6, 7 and 9, for the remaining third opening gaps 320 other than the part of the third opening gaps 320 described above, the remaining third opening gaps 320 may be roughly the same as the second opening gaps 310 in shape and size. Because the limited space in the stretching non-display region B1, it may not possible to arrange the first opening gaps 200 with uniform distribution, the remaining third opening gaps 320 is formed in combination with an arraying mode of the second opening gaps in the stretching display region B2, thus the technological setting difficulty may be reduced, and the gaps in the stretching non-display region B1 may further be distributed uniformly to further reduce the stress effect.

In specific implementation, in the embodiment of the present disclosure, as shown in FIG. 6 and FIG. 7, the second region AA may include a plurality of second pixel units PX2, and the second pixel units PX2 include first-color sub pixels 010, second-color sub pixel pairs and third-color sub pixels 030. Here, each second-color sub pixel pair includes two second-color sub pixels 020. The first-color sub pixels 010 are configured to emit light with first color, the second-color sub pixels 021 and 022 are configured to emit light with second color, and the third-color sub pixels 030 are configured to emit light with third color. In some examples, the first color, the second color and the third color may be selected from red, green and blue. For example, the first color is red, the second color is green, and the third color is blue. Certainly, the embodiment of the present disclosure includes but is not limited to this. The above first color, second color and third color may further be other colors.

Electroluminescent diodes such as an organic light emitting diode (OLED) and quantum dot light emitting diodes (QLED) have the advantages of autoluminescence, low energy consumption and the like, and in specific implementation, the display panel may be an electroluminescent display panel. In the embodiment of the present disclosure, the first-color sub pixels, the second-color sub pixels and the third-color sub pixels may include electroluminescent diodes and driving circuits configured to drive the electroluminescent diodes to emit light respectively. Each electroluminescent diode includes an anode layer, a light emitting layer and a cathode layer arranged in a stacked mode. Further, the electroluminescent diodes may be OLEDs, and in this way, the display panel in the present disclosure may be provided as the OLED display panel. Alternatively, the electroluminescent diodes may also be the QLEDs, and in this way, the display panel in the present disclosure may be provided as the QLED display panel. In the OLED display panel, the driving circuit is generally and internally provided with a driving transistor configured to generate a work current for driving the OLEDs to emit light, a storage capacitor configured to stabilize the voltage of a gate of the driving transistor, a scanning control transistor configured to control data signal input, and a light emitting control transistor configured to control the OLEDs to emit light. Certainly, in actual application, the driving circuit further includes other transistors, and a structure of the driving circuit may be the structure in the related art, which is not repeated here.

In specific implementation, in the embodiment of the present disclosure, as shown in FIG. 7, the plurality of second pixel units PX2 are arrayed in the first direction F1 to form pixel unit rows, the pixel unit rows are arrayed in the second direction F2, and the second pixel units PX2 in the two adjacent pixel unit rows are staggered. The second pixel units PX2 in the odd-numbered row and the second pixel units PX2 in the even-numbered row are staggered, the second pixel units PX2 in the odd-numbered row are aligned in the second direction F2, and the second pixel units PX2 in the even-numbered row are aligned in the second direction F2. Exemplarily, the second pixel units PX2 in the two adjacent pixel unit rows are differed by ½ the size of the second pixel unit PX2. It should be noted that the size of one above second pixel unit PX2 may be a distance between centers of the sub pixels with the same color in the two adjacent second pixel units PX2 in the first direction F1. For example, the size of one above second pixel unit PX2 may be a distance between centers of the first-color sub pixels 010 in the two adjacent second pixel units PX2 in the first direction F1. Alternatively, for example, the second pixel units PX2 in the adjacent pixel unit rows are mutually staggered in the second direction F2, which means that, the adjacent staggered second pixel units PX2 in the adjacent pixel unit rows have certain offset in the first direction F1. Therefore, the staggered sub pixels with the same color in the adjacent pixel unit rows are not aligned in the second direction F2.

In specific implementation, in the embodiment of the present disclosure, as shown in FIG. 7, the first pixel units PX1 in the stretching display region B2 may be arranged in an array. The first pixel units PX1 may also include first-color sub pixels 010, second-color sub pixels 020 and third-color sub pixels 030. In this way, the stretching display region B2 may be displayed in color. Exemplarily, a pixel distribution density in the first region BB may be smaller than that in the second region AA. It should be noted that the pixel distribution density may refer to the number of the pixels uniformly arranged the unit area. If the number of pixels per unit area is high, the pixel distribution density is high, and a resolution ratio is high. Otherwise, if the number of pixels per unit area is small, the pixel distribution density is low, and the resolution ratio is low.

In specific implementation, in the embodiment of the present disclosure, as shown in FIG. 7, a distance W1 between centers of every two adjacent light emitting structures 110 in the first direction F1 may be roughly equal to a width of the two corresponding second pixel units PX2 in the first direction F1. Alternatively, the distance W1 between the centers of the every two adjacent light emitting structures 110 in the first direction F1 may also be greater than the width of the two corresponding second pixel units PX2 in the first direction F1. Certainly, in actual application, it may be designed and determined according to needs of the actual application, which is not limited here.

In specific implementation, in the embodiment of the present disclosure, as shown in FIG. 7, a distance W2 between centers of every two adjacent light emitting structures 110 in the second direction F2 may be roughly equal to a width of the four corresponding second pixel units PX2 in the second direction F2. Alternatively, the distance W2 between the centers of the every two adjacent light emitting structures 110 in the second direction F2 may also be greater than the width of the four corresponding second pixel units PX2 in the second direction F2. Certainly, in actual application, it may be designed and determined according to needs of the actual application, which is not limited here.

In specific implementation, in the embodiment of the present disclosure, as shown in FIG. 5 to FIG. 7, in the same first pixel unit PX1, the first-color sub pixels 010 and the third-color sub pixels 030 may be arranged on the same row, and the second-color sub pixels 020 are located on a row adjacent to the row where the first-color sub pixels 010 and the third-color sub pixels 030 are located. In this way, the second-color sub pixels and the first-color sub pixels 010 may be arranged on the different rows. Further, in the same first pixel unit PX1, the first-color sub pixels 010 and the third-color sub pixels 030 may be arrayed sequentially in the first direction F1, for example, in the direction of an arrow of F1. Certainly, the present disclosure includes but is not limited to this.

In specific implementation, in the embodiment of the present disclosure, as shown in FIG. 5 to FIG. 7, in the same first pixel unit PX1, an orthographic projection of the center of the second-color sub pixel 020 on a connecting line between the center of the first-color sub pixel 010 and the center of the third-color sub pixels 030 is located between the center of the first-color sub pixel 010 and the center of the third-color sub pixel 030. For example, in the same first pixel unit PX1, the first-color sub pixels 010 and the third-color sub pixels 030 are located in the first row, and the second-color sub pixels 020 are located in the second row. In this way, the connecting line of the center of the first-color sub pixel 010, the center of the second-color sub pixel 020 and the center of the third-color sub pixel 030 in the same first pixel unit PX1 may roughly constitute a triangle.

It should be noted that in the display panel provided by the embodiment of the present disclosure, the center of the sub pixel refers to the center of a light emitting region of the sub pixel. Taking the OLED display panel as an example, the OLED display panel generally further includes a pixel definition layer. The pixel definition layer has a plurality of openings which define light emergent regions of the OLEDs in the sub pixels. Therefore, the light emergent regions defined by the openings during display are the light emitting regions of the sub pixels.

Figure 10:
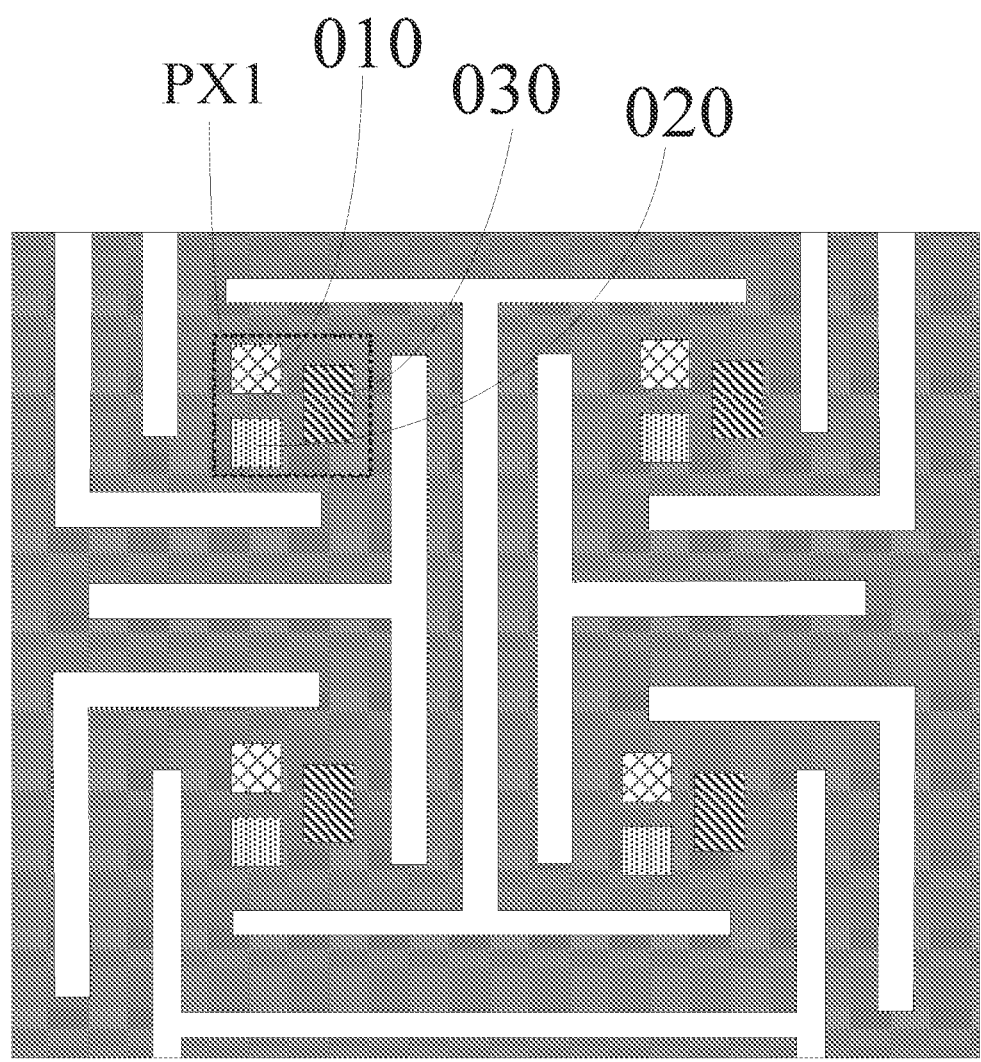
FIG. 10 is a schematic diagram of some other structures of the stretching display region in the display panel in some embodiments of the present disclosure.

In specific implementation, in the embodiment of the present disclosure, as shown in FIG. 10, in the same first pixel unit PX1, the first-color sub pixel 010 and the second-color sub pixel 020 may also be arranged on the same column, and the third-color sub pixel 030 is located on a column adjacent to the column where the first-color sub pixel 010 and the second-color sub pixel are located. In this way, the third-color sub pixels 030 and the first-color sub pixels 010 may be arranged on the different rows. Further, in the same first pixel unit PX1, the first-color sub pixels 010 and the second-color sub pixels 020 may be arrayed sequentially in the second direction F2, for example, in the direction of an arrow of F2.

In specific implementation, in the embodiment of the present disclosure, as shown in FIG. 10, in the same first pixel unit PX1, an orthographic projection of the center of the third-color sub pixel 030 on a connecting line between the center of the first-color sub pixel 010 and the center of the second-color sub pixel 020 is located between the center of the first-color sub pixel 010 and the center of the second-color sub pixel 020. For example, in the same first pixel unit PX1, the first-color sub pixel 010 and the second-color sub pixel 020 are located in the first column, and the third-color sub pixel 030 is located in the second column. In this way, the connecting lines of the center of the first-color sub pixel 010, the center of the second-color sub pixel 020 and the center of the third-color sub pixel 030 in the same first pixel unit PX1 may roughly constitute a triangle.

In specific implementation, in the embodiment of the present disclosure, as shown in FIG. 5 to FIG. 8 and FIG. 10, in the first pixel unit PX1, a light emitting area of the third-color sub pixel 030 may be greater than that of the first-color sub pixel 010 and that of the second-color sub pixel 020. Exemplarily, as shown in FIG. 5 to FIG. 8, the light emitting area of the first-color sub pixel 010 may be greater than that of the second-color sub pixel 020, or as shown in FIG. 10, the light emitting area of the first-color sub pixel 010 may also be roughly equal to that of the second-color sub pixel 020. Exemplarily, the first pixel unit PX1 may be configured according to an implementation that a light emitting area of the blue sub pixel is greater than that of the red sub pixel and the light emitting area of the red sub pixel is greater than that of the green sub pixel. Alternatively, the first pixel unit PX1 may also be configured according to an implementation that the light emitting area of the blue sub pixel is greater than that of the red sub pixel and the light emitting area of the red sub pixel is roughly equal to that of the green sub pixel. In actual application, it may be designed and determined according to needs of the actual application, which is not limited here. It should be noted that an area occupied by the light emitting region of the sub pixel may serve as the light emitting area.

In specific implementation, in the embodiment of the present disclosure, as shown in FIG. 5 to FIG. 8 and FIG. 10, in the first region BB, the arrangement of the sub pixels in each first pixel unit PX1 may be the same, thereby facilitating technological composition.

In specific implementation, in the embodiment of the present disclosure, as shown in FIG. 6 and FIG. 7, the transition region B3 also includes at least one third pixel unit PX3; and the at least one third pixel unit PX3 may also include a first-color sub pixel 010, a second-color sub pixel 020 and a third-color sub pixel 030. A pixel distribution density in the transition region B3 is smaller than that in the second region AA, and greater than or roughly equal to that in the stretching display region B2. By arranging the transition region B3, the brightness of the second region AA may be transitioned to the stretching display region B2 through the transition region B3 to prevent the problem of dark fringes in a boundary, close to the second region AA, of the first region BB.

In specific implementation, in the embodiment of the present disclosure, as shown in FIG. 6 and FIG. 7, the arrangement of the sub pixels in the second pixel unit PX2 may be the same as that of the sub pixels in the first pixel unit PX1, thereby further facilitating technological composition.

In specific implementation, in the embodiment of the present disclosure, as shown in FIG. 6 and FIG. 7, the sub pixels in the first region BB are on the same row as some of the sub pixels in the second region AA, such that, the sub pixels in the first region BB correspond to the sub pixels in the second region AA in the row direction, and are not arranged on the different rows or the different columns. In this way, during manufacturing, in sub pixel masks originally and regularly arrayed in the whole display region, the part of the sub pixels in the second region AA is removed, and a manufacturing technology is relatively easy to realize.

In specific implementation, in the embodiment of the present disclosure, as shown in FIG. 6 and FIG. 7, the sub pixels in the stretching display region B2 are in the same column as some of the sub pixels in the second region AA, such that, the sub pixels in the first region BB correspond to the sub pixels in the second region AA in the column direction, and are not arranged on the different rows or the different columns. In this way, during manufacturing, in the sub pixel masks originally and regularly arrayed in the whole display region, the part of the sub pixels in the second region AA is removed, and the manufacturing technology is relatively easy to realize.

Figure 11:
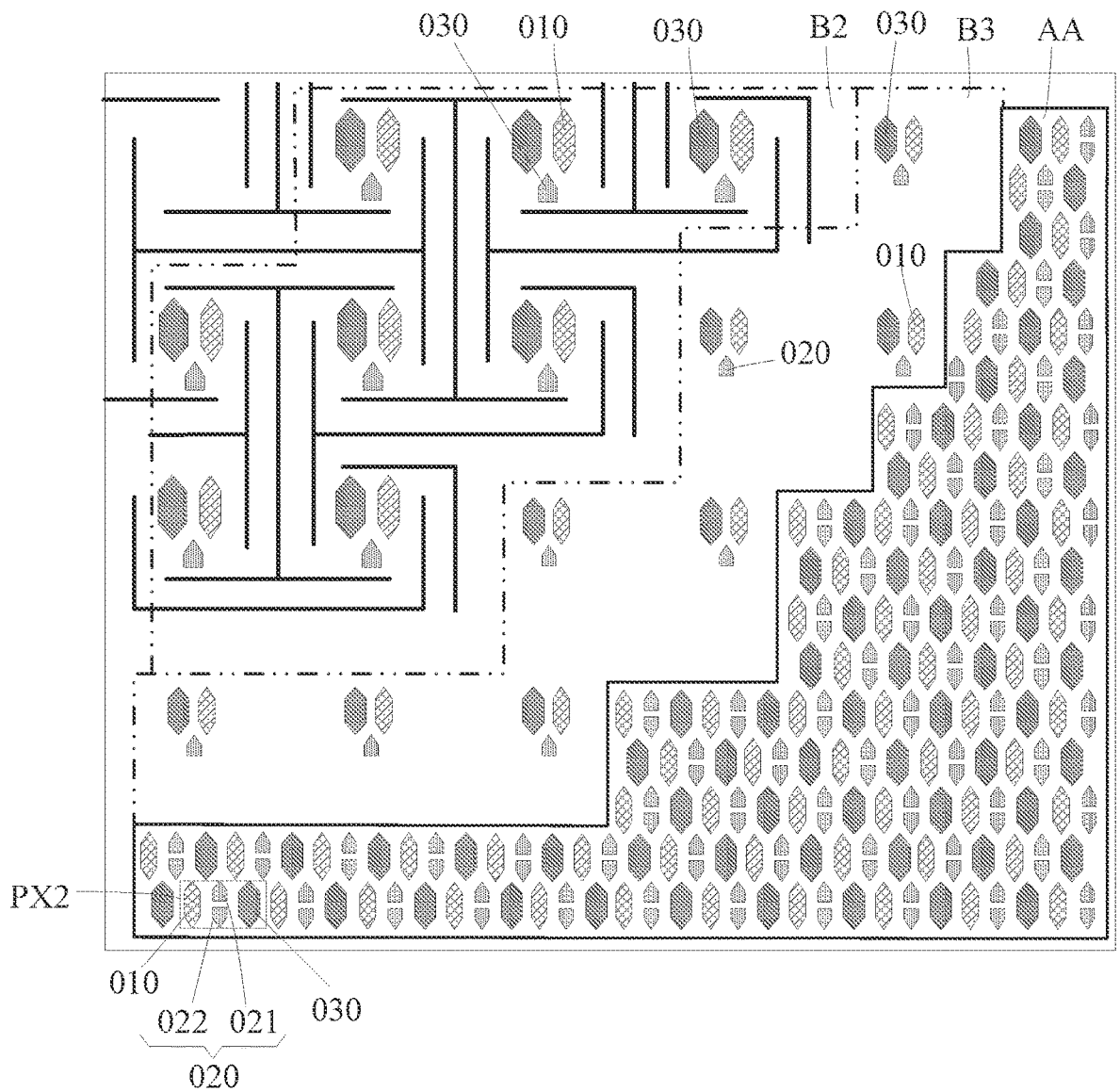
FIG. 11 is a schematic diagram of some further local structures of the display panel in some embodiments of the present disclosure.

In specific implementation, in the embodiment of the present disclosure, as shown in FIG. 7, the light emitting area of one first-color sub pixel 010 in the stretching display region B2 may be roughly equal to that of one first-color sub pixel 010 in the transition region B3. Alternatively, as shown in FIG. 11, the light emitting area of one first-color sub pixel 010 in the stretching display region B2 may also be greater than that of one first-color sub pixel 010 in the transition region B3. Certainly, in actual application, it may be designed and determined according to needs of the actual application, which is not limited here.

In specific implementation, in the embodiment of the present disclosure, as shown in FIG. 7, the light emitting area of one second-color sub pixel 020 in the stretching display region B2 may be roughly equal to that of one second-color sub pixel 020 in the transition region B3. Alternatively, as shown in FIG. 11, the light emitting area of one second-color sub pixel 020 in the stretching display region B2 may also be greater than that of one second-color sub pixel 020 in the transition region B3. Certainly, in actual application, it may be designed and determined according to needs of the actual application, which is not limited here.

In specific implementation, in the embodiment of the present disclosure, as shown in FIG. 7, the light emitting area of one third-color sub pixel 030 in the stretching display region B2 may be roughly equal to that of one third-color sub pixel 030 in the transition region B3. Alternatively, as shown in FIG. 11, the light emitting area of one third-color sub pixel 030 in the stretching display region B2 may also be greater than that of one third-color sub pixel 030 in the transition region B3. Certainly, in actual application, it may be designed and determined according to needs of the actual application, which is not limited here.

Figure 12:
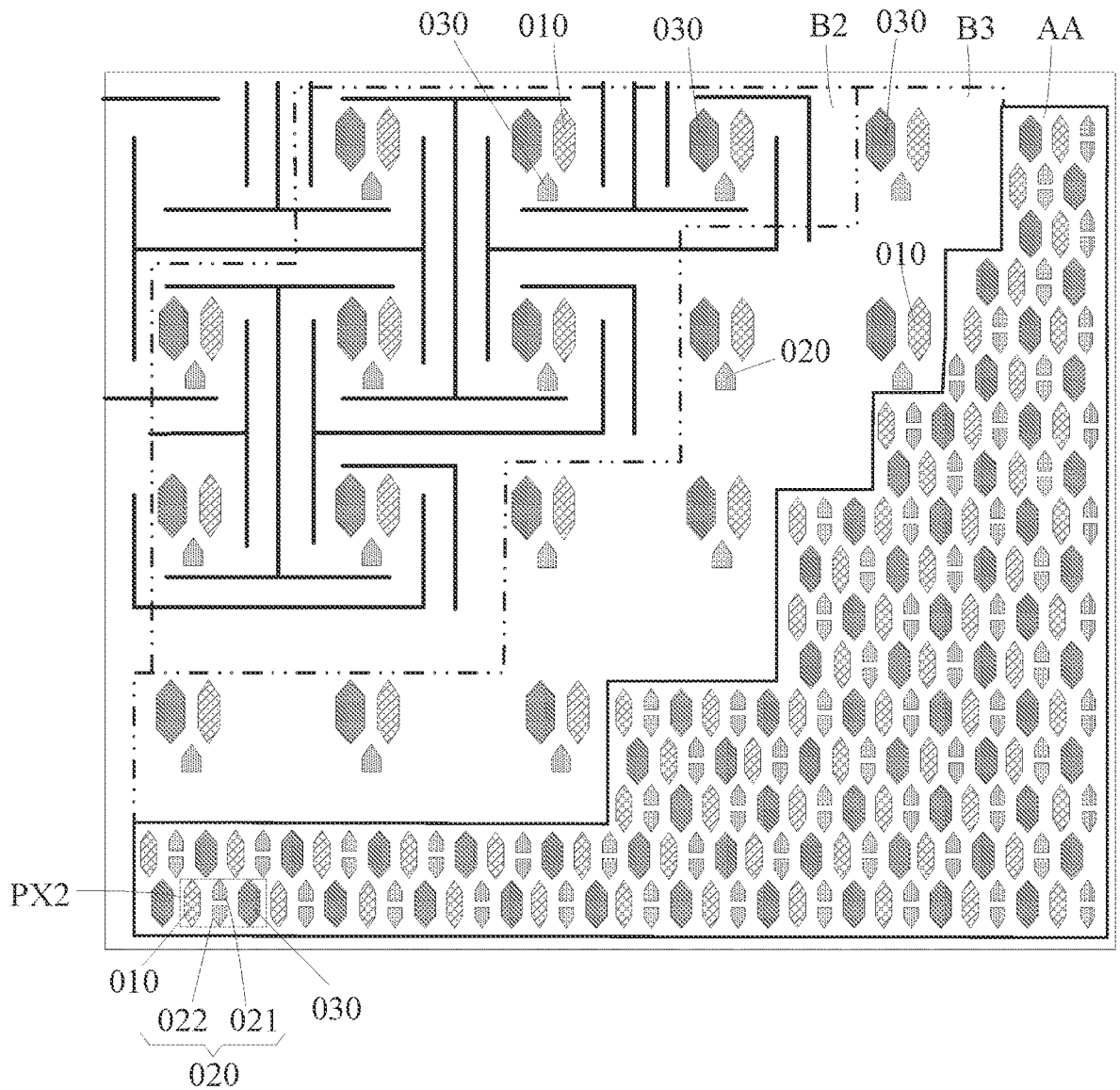
FIG. 12 is a schematic diagram of some yet further local structures of the display panel in some embodiments of the present disclosure.

In specific implementation, in the embodiment of the present disclosure, as shown in FIG. 7 and FIG. 11, the light emitting area of one first-color sub pixel 010 in the transition region B3 may be roughly equal to that of one first-color sub pixel 010 in the second region AA. Alternatively, as shown in FIG. 12, the light emitting area of one first-color sub pixel 010 in the transition region B3 may also be greater than that of one first-color sub pixel 010 in the second region AA. Certainly, in actual application, it may be designed and determined according to needs of the actual application, which is not limited here.

In specific implementation, in the embodiment of the present disclosure, as shown in FIG. 7 and FIG. 11, the light emitting area of one second-color sub pixel 020 in the transition region B3 may be roughly equal to that of one second-color sub pixel 020 in the second region AA. Alternatively, as shown in FIG. 12, the light emitting area of one second-color sub pixel 020 in the transition region B3 may also be greater than that of one second-color sub pixel 020 in the second region AA. Certainly, in actual application, it may be designed and determined according to needs of the actual application, which is not limited here.

In specific implementation, in the embodiment of the present disclosure, as shown in FIG. 7 and FIG. 11, the light emitting area of one third-color sub pixel 030 in the transition region B3 may be roughly equal to that of one third-color sub pixel 030 in the second region AA. Alternatively, as shown in FIG. 12, the light emitting area of one third-color sub pixel 030 in the transition region B3 may also be greater than that of one third-color sub pixel 030 in the second region AA. Certainly, in actual application, it may be designed and determined according to needs of the actual application, which is not limited here.

Figure 13:
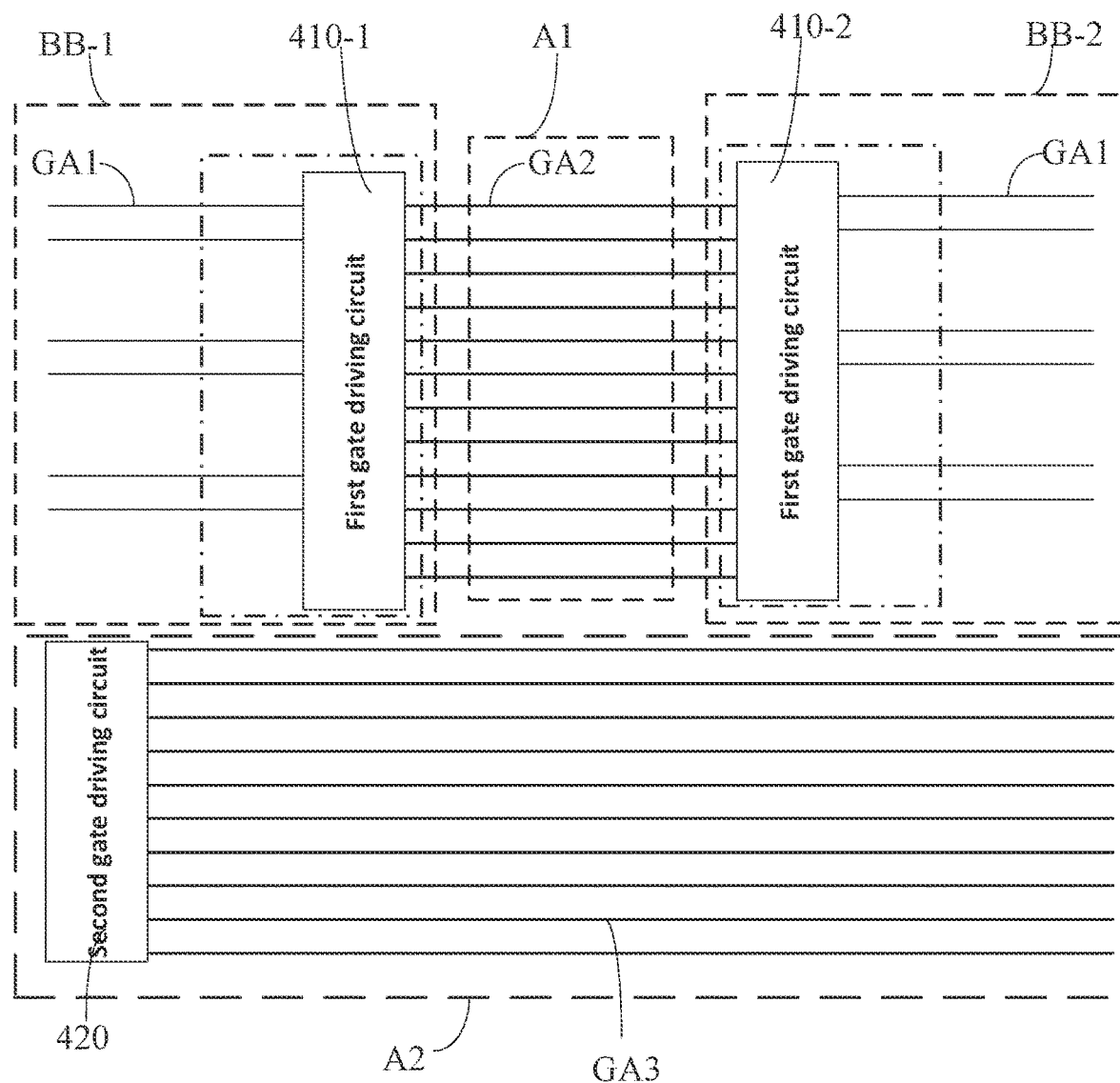
FIG. 13 is a further schematic structural diagram of the display panel in some embodiments of the present disclosure.

In the OLED display panel, data signals are usually transmitted by data cables, and gate scan signals are transmitted by scanning lines to scanning control transistors to drive the scanning control transistors to input the data signals. A light emitting control signal lines are generally adopted to transmit light emitting control signals to the light emitting control transistor to drive the light emitting control transistors to control the OLED to emit light. In specific implementation, in the embodiment of the present disclosure, as shown in FIG. 13, the first region BB may further include a plurality of first scanning lines GA1. The sub pixels located on one row in the first region BB are electrically connected with one first scanning line GA1, and the first scanning line GA1 is electrically connected with gates of the scanning control transistors in the corresponding sub pixels and configured to transmit a signal for controlling conducting or cut-off to the scanning control transistors. Exemplarily, the first scanning lines GA1 may be arranged in the light emitting structures 110 arrayed in the first direction F1 and the flexible bridging parts 120 between the light emitting structures 110 arrayed in the first direction F1. Certainly, the present disclosure includes but is not limited to this.

In specific implementation, in the embodiment of the present disclosure, the data cables, the light emitting control signal lines and other signal lines needing to be arranged on the OLED display panel may be arranged through the light emitting structures 110 and the flexible bridging parts 120 between the light emitting structures 110 in an extending mode.

In specific implementation, in the embodiment of the present disclosure, as shown in FIG. 13, the transition region B3 may further include first gate driving circuits, the first gate driving circuits are electrically connected with all the first scanning lines GA1, and configured to drive the first scanning lines GA1. The pixel distribution density in the transition region B3 is smaller than that in the second region AA, and thus a blank region not provided with the second pixel units PX2 may be fanned out by the transition region B3. The first gate driving circuits are arranged in the blank region to reduce an occupied area of the non-display region.

In specific implementation, in the embodiment of the present disclosure, the second region AA includes a first conventional region A1 and a second conventional region A2 arrayed in the second direction F2, and the first conventional region A1 and the first region BB are arrayed in the first direction F1. Exemplarily, as shown in FIG. 4 and FIG. 11, the first region BB is the region where the four top corners of the flexible substrate 100 are located. Taking an example that the region where the top corner at the top left corner of the flexible substrate 100 is located serves as the first region BB-1 and the region where the top corner at the top right corner of the flexible substrate 100 is located serves as the first region BB-2, the first conventional region A1 is located between the first region BB-1 and the first region BB-2. That is, the first region BB-1 and the first region BB-2 are spaced by the first conventional region A1.

In specific implementation, in the embodiment of the present disclosure, as shown in FIG. 4 and FIG. 13, the first conventional region A1 may include a plurality of second scanning lines GA2, one row of second pixel units PX2 is electrically connected with one second scanning line GA2, and the first gate driving circuits are further electrically connected with all the second scanning lines GA2, and further configured to drive the second scanning lines GA2. Exemplarily, the first gate driving circuit includes a plurality of cascaded shilling registers, each shifting register is electrically connected with one second scanning line GA2, and one shifting register in each part of the shifting registers is electrically connected with one first scanning line GA1. Further, as for same driving, the first scanning lines GA1 and the second scanning lines GA2 electrically connected with the sub pixels located on the same row in the first regions BB-1 and BB-2 and the first conventional region A1 are electrically connected with the same shift register in the first gate driving circuit. Therefore, the sub pixels in one row can be driven in a unified mode.

In specific implementation, in the embodiment of the present disclosure, as shown in FIG. 13, the first gate driving circuit 410-1 is arranged in the first region BB-1, and the first gate driving circuit 410-2 is arranged in the first region BB-2. The first scanning lines GA1 and the second scanning lines GA2 electrically connected with the sub pixels located on the same row in the first regions BB-1 and BB-2 and the first conventional region A1 are electrically connected with the shift registers of the same stage in the first grid driving circuits 410-1 and 410-2, thereby realizing a bilateral region.

In specific implementation, in the embodiment of the present disclosure, as shown in FIG. 13, the second conventional region A2 may include a plurality of third scanning lines GA3 and a second gate driving circuit 420. The second gate driving circuit 420 includes a plurality of cascaded shifting registers, and one shifting register is electrically connected with one third scanning line GA3. In actual application, the two second gate driving circuits may be arranged, and one third scanning line is electrically connected with the shifting registers of the same stage in the two second grid driving circuits, thereby realizing bilateral driving.

Based on the same inventive concept, an embodiment of the present disclosure further provides a curved display device, including the above display panel provided by the embodiment of the present disclosure. The principle for solving the problems by the curved display device is similar to that of the aforementioned display panel, thus the curved display device may be implemented by referring to that of the display panel, which is not repeated here.

In specific implementation, in the embodiment of the present disclosure, the curved display device may be any product or component with a display function, such as a mobile phone, a tablet computer, a television, a displayer, a notebook computer, a digital photo frame and a navigator. It should be understood by a person of ordinary skill in the art that the curved display device should have other essential constituent parts, which is not repeated here and may also not be regarded as limitation to the present disclosure.

According to the above display panel and the curved display device provided by the embodiments of the present disclosure, the flexible substrate may be designed in the zoning mode by enabling the flexible substrate to include the first region and the second region. The first region may include: the plurality of light emitting structures and the plurality of flexible bridging parts. Because the flexible bridging parts have the good flexible performance, and the every two adjacent light emitting structures may be connected through the at least one flexible bridging part, in this way, the light emitting structures may be mutually connected. A space between the light emitting structures may be arranged to be of a hollowed-out structure by forming the first opening gap between the every two adjacent light emitting structures. Thus when stresses occur in the first region during bending, the stresses may be released through the first opening gaps to reduce the stress effect. Therefore, after the display panel has been bonded to the 3D package substrate, the stress effect can be reduced, and the quadrilateral surface curved stereo display form is realized.

Although the preferred embodiments of the present disclosure have been described, those skilled in the art can make additional modifications and variations on the embodiments once they know the basic creative concept. Therefore, the appended claim intends to be explained as including the preferred embodiments and all modifications and variations falling within the scope of the present disclosure.

Obviously, those skilled in the art can make various modifications and variations to the present disclosure without departing from the spirit and scope of the present disclosure. In this way, if these modifications and variations of the present disclosure fall within the scope of the claims of the present disclosure and their equivalent art, the present disclosure also intends to include these modifications and variations.

What is claimed is:

1. A display panel, comprising:
   a flexible substrate, comprising a first region and a second region, wherein the first region comprises:
   a plurality of light emitting structures with first opening gaps each formed between two adjacent light emitting structures; and
   a plurality of flexible bridging parts, with at least one flexible bridging part connecting two adjacent light emitting structures;
   wherein the flexible substrate is substantially in a rectangle shape, and a top corner of the flexible substrate is an arc-shaped angle; and
   the first region comprises a region where at least one of four top corners of the flexible substrate is located.

2. The display panel of claim 1, wherein the first region has a stretching non-display region, a stretching display region and a transition region, and wherein
   the transition region is located between the stretching display region and the second region,
   the stretching non-display region is located on one side, away from the transition region, of the stretching display region, and comprises a plurality of third opening gaps arrayed at intervals, wherein at least part of the plurality of third opening gaps extend to an edge of the flexible substrate; and
   the stretching display region has the plurality of light emitting structures and the plurality of flexible bridging parts, and further comprises a plurality of second opening gaps formed at intervals, wherein the plurality of second opening gaps are located on one side, facing the transition region, of light emitting structures close to an edge of the stretching display region.

3. The display panel of claim 2, wherein:
   the plurality of light emitting structures in the stretching display region are arranged in an array; the first opening gaps comprise a plurality of first sub opening gaps formed at intervals, and a first sub opening gap comprises a first gap part extending in a first direction, and a second gap part and a third gap part extending in a second direction;

every two adjacent rows of light emitting structures serve as a structure row; in a same structure row, two adjacent columns of light emitting structures serve as a first light emitting structure group; and in two structure rows sharing a same row of light emitting structures, first light emitting structure groups are staggered; and one first light emitting structure group is correspondingly provided with one first sub opening gap, the first gap part is located between the two rows of light emitting structures in the first light emitting structure group, and the second gap part and the third gap part are located between two adjacent first light emitting structure groups.

4. The display panel of claim 2, wherein:

the first opening gaps comprise a plurality of second sub opening gaps formed at intervals, and a second sub opening gap comprises a fourth gap part and a fifth gap part extending in the first direction, and a sixth gap part extending in the second direction;

every two adjacent columns of light emitting structures serve as a structure column; in a same structure column, two adjacent rows of light emitting structures serve as a second light emitting structure group; and in two structure columns sharing a same column of light emitting structures, second light emitting structure groups are staggered; and one second light emitting structure group is correspondingly provided with one second sub opening gap, the sixth gap part is located between the two columns of light emitting structures in the second light emitting structure group, and the fourth gap part and the fifth gap part are located between two adjacent second light emitting structure groups.

5. The display panel of claim 4, wherein:

in the same structure row, one sixth gap part is arranged between first sub opening gaps corresponding to the two adjacent first light emitting structure groups; and in the same structure column, one first gap part is arranged between second sub opening gaps corresponding to the two adjacent second light emitting structure groups.

6. The display panel of claim 2, wherein a second opening gap comprises a seventh gap part extending in the first direction and a eighth gap part extending in the second direction;

a part of the plurality of third opening gaps and the first opening gaps have substantially an equal shape and size; and rest of the plurality of third opening gaps except for the part and the second opening gaps have substantially an equal shape and size.

7. The display panel of claim 2, wherein the plurality of light emitting structures comprise at least one first pixel unit, and the at least one first pixel unit comprises a first-color sub pixel, a second-color sub pixel and a third-color sub pixel; and the second region comprises a plurality of second pixel units with second pixel units in two adjacent rows are staggered, and the plurality of second pixel units comprise first-color sub pixels, second-color sub pixel pairs and third-color sub pixels, wherein each second-color sub pixel pair comprises two second-color sub pixels.

8. The display panel of claim 7, wherein a distance between centers of two adjacent light emitting structures in the first direction is greater than or substantially equal to a width of two second pixel units in the first direction;

a distance between centers of two adjacent light emitting structures in the second direction is greater than or substantially equal to a width of four second pixel units in the second direction.

9. The display panel of any one of claim 8, wherein in one of the at least one first pixel unit:

the first-color sub pixel and the second-color sub pixel are arranged on a same column, and the third-color sub pixel is located on a column adjacent to the column where the first-color sub pixel and the second-color sub pixel are located; and an orthographic projection of the center of the third-color sub pixel on a connecting line between the center of the first-color sub pixel and the center of the second-color sub pixel is located between the center of the first-color sub pixel and the center of the second-color sub pixel.

10. The display panel of claim 8, wherein the sub pixels in the stretching display region and some of the sub pixels in the second region are located on a same column.

11. The display panel of claim 10, wherein the first region further comprises a plurality of first scanning lines, and the sub pixels located on one row in the first region are electrically connected with one first scanning line; and the transition region comprises a first gate driving circuit, wherein the first gate driving circuit is electrically connected with the plurality of first scanning lines, and configured to drive the plurality of first scanning lines.

12. The display panel of claim 11, wherein the second region comprises a first conventional region and a second conventional region arrayed in the second direction, and the first conventional region and the first region are arrayed in the first direction; and the first conventional region comprises a plurality of second scanning lines, one row of the second pixel units is electrically connected with one second scanning line, and the first gate driving circuit is further electrically connected with the plurality of second scanning lines, and configured to drive the plurality of second scanning lines.

13. The display panel of claim 12, wherein for a first scanning line and a second scanning line electrically connected with the sub pixels located on a same row in the first region and the first conventional region, the first scanning line and the second scanning line are electrically connected with a same shift register in the first gate driving circuit.

14. The display panel of claim 7, wherein in one of the at least one first pixel unit, the first-color sub pixel and the third-color sub pixel are arranged on a same row, and the second-color sub pixel is located on a row adjacent to the row where the first-color sub pixel and the third-color sub pixel are located; and an orthographic projection of a center of the second-color sub pixel on a connecting line between a center of the first-color sub pixel and a center of the third-color sub pixel is located between the center of the first-color sub pixel and the center of the third-color sub pixel.

15. The display panel of claim 14, wherein in the at least one first pixel unit, a light emitting area of the third-color sub pixel is greater than a light emitting area of the first-color sub pixel and a light emitting area of the second-color sub pixel; and in the at least one first pixel unit, the light emitting area of the first-color sub pixel is greater than or substantially equal to the light emitting area of the second-color sub pixel.

16. The display panel of claim 7, wherein the transition region comprises at least one third pixel unit; the at least one third pixel unit comprises a first-color sub pixel, a second-color sub pixel and a third-color sub pixel;

a pixel distribution density in the transition region is smaller than a pixel distribution density in the second region, and the pixel distribution density in the transition region is greater than or substantially equal to a pixel distribution density in the stretching display region.

17. The display panel of claim 2, wherein a light emitting area of one first-color sub pixel in the stretching display region is greater than or substantially equal to a light emitting area of one first-color sub pixel in the transition region;

a light emitting area of one second-color sub pixel in the stretching display region is greater than or substantially equal to a light emitting area of one second-color sub pixel in the transition region; and a light emitting area of one third-color sub pixel in the stretching display region is greater than or substantially equal to a light emitting area of one third-color sub pixel in the transition region.

18. The display panel of claim 17, wherein a light emitting area of one first-color sub pixel in the transition region is greater than or substantially equal to a light emitting area of one first-color sub pixel in the second region;

a light emitting area of one second-color sub pixel in the transition region is greater than or substantially equal to a light emitting area of one second-color sub pixel in the second region; and a light emitting area of one third-color sub pixel in the transition region is greater than or substantively equal to a light emitting area of one third-color sub pixel in the second region.

19. A curved display device, comprising the display panel of claim 1.

\* \* \* \* \*